United States Patent
Sohtome

(10) Patent No.: US 7,312,464 B2
(45) Date of Patent: Dec. 25, 2007

(54) ION IMPLANTATION APPARATUS

(75) Inventor: Yoshihiro Sohtome, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 261 days.

(21) Appl. No.: 11/235,663

(22) Filed: Sep. 27, 2005

(65) Prior Publication Data

US 2006/0076512 A1  Apr. 13, 2006

(51) Int. Cl.
  *H01J 37/317* (2006.01)
(52) U.S. Cl. .............. 250/492.21; 250/441.11
(58) Field of Classification Search .......... 250/492.21, 250/441.11, 440.11
  See application file for complete search history.

(56) References Cited

U.S. PATENT DOCUMENTS

| 4,680,474 A | 7/1987 | Turner et al. |
| 4,743,767 A | 5/1988 | Plumb et al. |
| 5,971,701 A * | 10/1999 | Kawamura et al. ......... 414/800 |
| 2005/0092938 A1 | 5/2005 | Garza et al. |

FOREIGN PATENT DOCUMENTS

JP  11-204075 A  7/1999

OTHER PUBLICATIONS

Patent Abstracts of Japan, vol. 017, No. 608 (E-1457), Nov. 9, 1993 & JP 05 190133 A (NEC Corp), Jul. 30, 1993.
Patent Abstracts of Japan, vol. 010, No. 255 (E-433) Sep. 2, 1986 & JP 61 081621 A (NEC Corp), Apr. 25, 1986.
International Search Report mailed Jul. 24, 2006 in corresponding EP appln. No. 05256025.7-2208.

* cited by examiner

*Primary Examiner*—Kiet T. Nguyen
(74) *Attorney, Agent, or Firm*—Nixon & Vanderhye, P.C.

(57) ABSTRACT

An ion implantation apparatus structure is provided that does not allow gas to accumulate in the vicinity of a wafer when implantation ions to the wafer. The ion implantation apparatus includes a rotating body that rotates in a fixed direction, a vacuum chamber that houses the rotating body, and an ion beam injecting portion that injects an ion beam to a wafer placed on the rotating body. The rotating body comprises one or more wafer placement boards having a wafer placement face on one face, a driving portion that drives the wafer placement board, and a gas evacuation member provided protruding from one face of the wafer placement board having a gas evacuation wall face on the front in the direction of rotation, and functions such that due to rotation of the wafer placement board, the gas evacuation wall face collides with gas present on one face of the wafer placement board and the gas is evacuated upward or to the rear face of the wafer placement face.

12 Claims, 33 Drawing Sheets

Direction of rotation

Scan direction of driving portion

Direction of rotation (A)

(B)

Direction of rotation (A)

Direction of rotation (B)

Direction of rotation (A1)

(B1)

(A2)

(B2)

(A)

(B)

Direction of rotation (A)

(A) Prescribed angle of elevation of the gas evacuation wall face using a plane parallel to the wafer placement face as a level plane

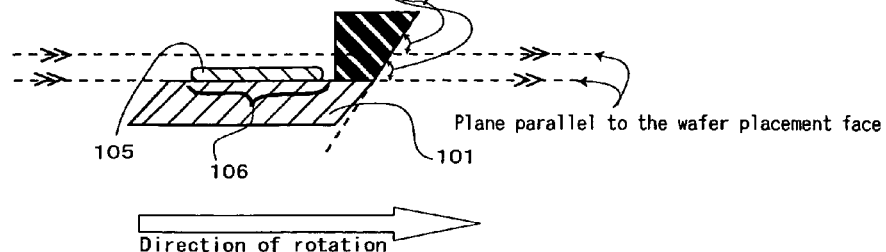

(B) Prescribed angle of elevation of the gas evacuation wall face using a plane parallel to the wafer placement face as a level plane

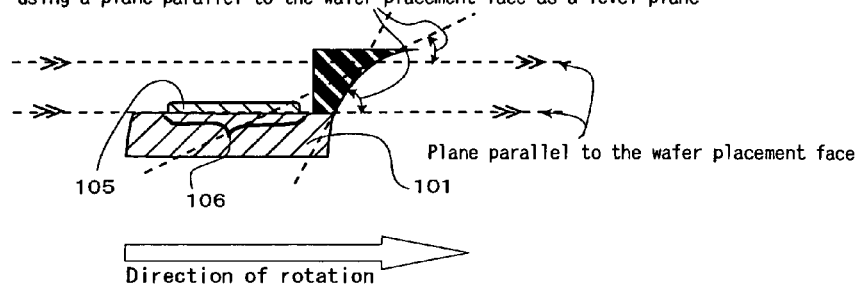

(C) Prescribed angle of elevation of the gas evacuation wall face using a plane parallel to the wafer placement face as a level plane

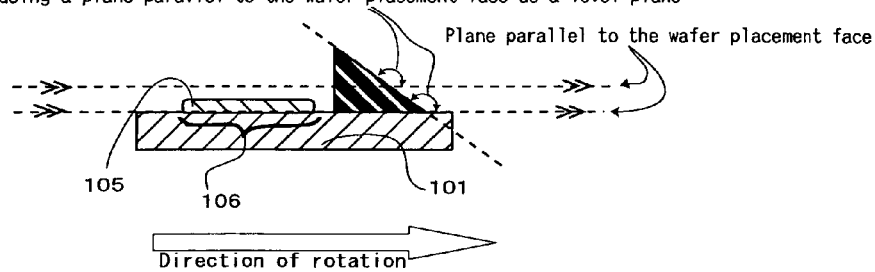

(D) Prescribed angle of elevation of the gas evacuation wall face using a plane parallel to the wafer placement face as a level plane

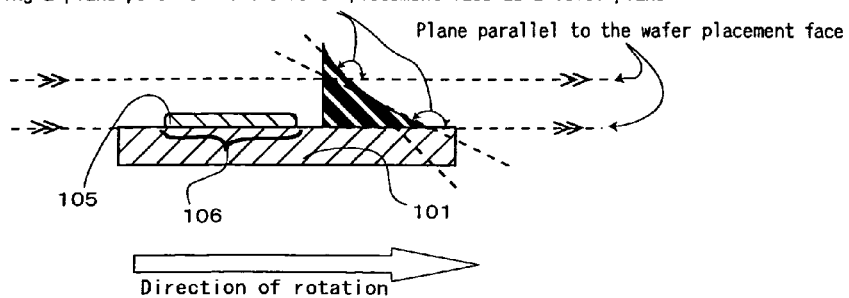

ION IMPLANTATION APPARATUS

BACKGROUND OF THE INVENTION (1) Field of the Invention

The present invention relates to an ion implantation apparatus used in the manufacture of semiconductor elements, and more specifically relates to a batch ion implantation apparatus.

(2) Description of the Prior Art

Local impurity dopant implantation (ion implantation) to semiconductor wafers is performed by injecting an ion beam in part of a semiconductor wafer disposed in a vacuum chamber.

Generally this sort of local ion beam irradiation is performed by a method wherein a photoresist mask is patterned on a semiconductor wafer and the wafer is partially covered by the mask.

However, when an ion beam is irradiated to the photoresist mask, outgas such as moisture and organic matter is generated from the photoresist. This outgas accompanies the ion beam and is injected into the wafer, and generates crystal defects by affixing to the wafer surface. It accumulates on the wafer, interferes with the ion beam and decreases the implantation accuracy of the impurity dopant. Thus, outgas causes the production yield of the semiconductor wafer to decrease.

However, in this type of ion implantation apparatus, outgas generated from the photoresist mask is unavoidable, and the generation of outgas cannot be eliminated. Therefore, in order to improve the production yield in semiconductor wafer production, it is important to quickly remove outgas from the wafer surface.

As technology that removes outgas from the wafer surface, there is for example JP H11-204075A. JP H11-204075A discloses a wafer loading member of an ion implantation apparatus that includes a rotatably driven support portion, a wafer holding portion wherein a wafer disposed on a circumference made the center of this support portion is held, and an intermediate portion that supports the wafer holding portion around the support portion by linking this wafer holding portion and the support portion, wherein the intermediate portion includes a gas aspirating means that aspirates gas from the face of the side of the wafer holding portion where the wafer is held towards the back side of the wafer holding portion. JP H11-204075A is distinguished in that by this aspirating means outgas is aspirated and evacuated to the back side of the face where the wafer is supported.

With this technology, outgas is aspirated and evacuated to the back side of the face where the wafer is supported by a gas aspirating means, but with simple gas aspiration it is not possible to quickly remove generated outgas from the wafer. Thus, even using the technology disclosed in JP H11-204075A, the occurrence of crystal defects caused by newly generated molecules of outgas joining to the wafer surface cannot be adequately prevented.

SUMMARY OF THE INVENTION

It is an object of the present invention to provide an ion implantation apparatus that solves the problems described above, in which by quickly expelling outgas generated from members of the configuration such as a wafer or a vacuum chamber, gas is not allowed to accumulate in the vicinity of the wafer.

First, an explanation of the terminology used in the present specification will be provided.

In the present specification, "wafer placement face" means a surface region for placing a wafer that is set to be one face of a wafer placement board.

"Wall face elevation angle" means an angle from a horizontal plane of the target wall face. For example, as shown in FIG. 33, when the target wall face is the wall face for gas evacuation, the gas evacuation wall face and a plane parallel to the target wall face form the wall face elevation angle. More specifically, it means an angle formed at a specific point on the crossover line that intersects the plane parallel to the wafer placement face and the target wall face, by a flat plane including all tangents when drawing a line tangential to the wall face and a plane parallel to the wafer placement face.

In the present specification, "outgas generated from the wafer" means molecular particles of gas given off from a wafer that has been irradiated with an ion beam, and gaseous particles of moisture, organic matter and the like generated from a photoresist mask performed on the wafer surface.

(1) An ion implantation apparatus according to a first embodiment of the present invention for solving the problems described above includes a rotating body that rotates in a fixed direction, a vacuum chamber that houses the rotating body, and an ion beam injecting portion that injects an ion beam to a wafer placed on the rotating body. The rotating body includes one or two or more wafer placement boards having a wafer placement face on one face, a gas discharge path for the purpose of discharging gas present on the wafer placement face to a face opposite to the wafer placement face, a gas evacuation member provided protruding from one face of the wafer placement board, having a first gas evacuation wall face, and a driving portion that rotates the wafer placement board. The gas evacuation member is disposed behind the gas discharge path in the direction of rotation, and the first wall face of the gas evacuation member is a frontal face in the direction of rotation and is a curved face or a flat face rising up from the one face having an angle of elevation greater than 0 degrees and less than 90 degrees when a plane parallel to the wafer placement face is used as a level plane, and the gas evacuation member functions such that gas is discharged from the gas discharge path to the face opposite to the one face of the wafer placement board by the first wall face colliding with gas present on one face of the wafer placement board due to rotation of the wafer placement board.

As stated above, when implanting an impurity dopant to the semiconductor wafer, outgas is generated from the photoresist mask. Thus, the vicinity of the wafer surface is covered by gas. Also, outgas given off from the constituent material of the vacuum chamber, residual ambient gas, and the like float in the vacuum chamber, and these gases also cover the vicinity of the wafer surface.

Herein, in the ion implanting apparatus with the configuration described above, on one face that is behind the gas discharge path in the direction of rotation and has a wafer placement face, a gas evacuation member is provided that has a first wall face with the shape stated above. Thus, due to rotation of the wafer placement board, the first wall face inevitably collides with gas present on one face of the wafer placement board. Due to this collision, the gas is biased in the direction of the entrance of the gas discharge path and is discharged to the face opposite to the one face of the wafer placement board.

That is, in the ion implantation apparatus with the above configuration, gas molecules of residual ambient gas or the like that are present in the vicinity of the wafer surface are immediately evacuated from the vicinity of the wafer surface with the start of apparatus operation, and outgas newly generated (outgas generated from the wafer or outgas generated from the constituent members of the vacuum chamber and rotating body) while the apparatus is operating is evacuated from the vicinity of the wafer surface immediately after being generated. Accordingly, deterioration of semiconductor quality caused by outgas or the like is suppressed, and as a result production yield in semiconductor manufacturing is markedly improved.

The ion implanting apparatus according to a first embodiment of the present invention described above can also adopt a configuration in which the gas evacuation member further has a second gas evacuation wall face that is a face other than the first wall face, and is a frontal face in the direction of rotation and comprises a curved face or a flat face having an angle of elevation greater than 90 degrees and less than 180 degrees when a plane parallel to the wafer placement face is used as a level plane.

In this configuration, because the second wall face having the shape stated above is provided further upward than the first wall face, gas is evacuated upward from the wafer placement face by the second wall face colliding with gas present on one face of the wafer placement board due to rotation of the wafer placement board. That is, gas and the like that is present at a position higher than the height of the first wall face is evacuated such that it is moved upward away from the wafer surface by the second wall face, and so it is possible to more reliably prevent accumulation of gas in the vicinity of the wafer surface.

(2) An ion implantation apparatus according to a second embodiment of the present invention includes a rotating body that rotates in a fixed direction, a vacuum chamber that houses the rotating body, and an ion beam injecting portion that injects an ion beam in a wafer placed on the rotating body. The rotating body comprises one or two or more wafer placement boards having a wafer placement face on one face, a gas evacuation member provided protruding from one face of the wafer placement board, having a gas evacuation wall face, and a driving portion that rotates the wafer placement board. The gas evacuation wall face is a frontal face in the direction of rotation, and is a curved face or a flat face rising up from the one face having an angle of elevation greater than 90 degrees and less than 180 degrees when a plane parallel to the wafer placement face is used as a level plane.

With the ion implantation apparatus of this configuration, because the gas evacuation member having a gas evacuation wall face with the shape described above is provided protruding from the one face of the wafer placement board, gas can be evacuated upward from the wafer placement face by colliding the gas evacuation wall face with gas present on one face of the wafer placement board due to rotation of the wafer placement board. Thus, gas such as outgas generated from the wafer, and outgas or residual ambient gas that floats inside the vacuum chamber, is removed from the wafer surface and the accumulation of gas on the wafer surface is prevented.

Here, an ordinary photoresist mask is executed on the wafer which is the target of ion beam irradiation. The ion implantation apparatus according to the present invention is an apparatus that injects an ion beam to the wafer, and when the present apparatus is used for this sort of wafer, outgas is generated from the photoresist mask due to the ion beam irradiation. The generation of this outgas is unavoidable, and causes the quality of the semiconductor to deteriorate. Accordingly, in order to improve semiconductor quality, it is important to quickly remove this outgas immediately after it is generated. Herein, with the configuration of the present invention, it is possible to quickly remove outgas generated from the wafer, and so semiconductor quality improves.

The ion implantation apparatus of the present invention in the above first and second embodiments can adopt a configuration in which the height from the wafer placement face of the gas evacuation member is more than 0.5 mm.

Ordinarily, a semiconductor wafer to which a dopant is implanted using an ion implantation apparatus has a thickness of about 0.5 mm. With the above configuration, because the height from the wafer placement face of the gas evacuation member is more than 0.5 mm, the thickness of the wafer placed on the wafer placement face is less than the height of the gas evacuation member. Thus, gas that flies in the direction of the wafer surface is impeded by the gas evacuation wall face of the gas evacuation member, and so it is difficult for gas to be accumulated in the vicinity of the wafer surface.

(3) The ion implantation apparatus of the present invention in the above first and second embodiments can adopt a configuration in which the rotating body is disk-shaped with two or more wafer placement boards radially arranged with the driving portion as a center of rotation, and two or more of the gas evacuation members on the rotating body are concentrically disposed relative to the center of rotation.

With this configuration, rotation of the rotating body becomes smooth, and it is furthermore possible to increase the wafer loading capacity. Also, because with this configuration two or more gas evacuation members are concentrically disposed, by concentrically disposing the wafers in accordance with this configuration, it is possible to make the rotational driving even smoother, and the ion beam can be effectively irradiated on the wafers. Further, an operating effect can be obtained in which outgas generated from the wafer surface is immediately evacuated by the gas evacuation members that are disposed on the same orbit as the wafers.

The ion implantation apparatus of the present invention in the first embodiment described above can further adopt a configuration in which the gas discharge path is a space between the two or more wafer placement boards.

With this configuration, because it is possible to utilize the space between wafer placement boards as a gas discharge path, it is not necessary to open a hole in the wafer placement board. Also, with this configuration, by changing the space between wafer placement boards it is possible to easily adjust the discharge capacity of the gas discharge path.

The ion implantation apparatus of the present invention in the first embodiment described above can adopt a configuration in which the wafer placement board is constituted by one disk-shaped board, the gas discharge path is constituted by a through-hole provided in the disk-shaped board, and the driving portion is disposed in the center of rotation of the disk-shaped board.

With this configuration, it is possible to increase the wafer loading capacity of the rotating body, and because the space of the side of the wafer placement face and the space of the side of the opposite face inside the vacuum chamber are divided by one disk, the shielding ratio of both spaces is high. Therefore the risk of gas present in the space of the side opposite to the wafer placement face flowing into the side of the wafer placement face is low, and so it is possible to more reliably prevent the accumulation of gas in the vicinity of the wafer surface. Also, with this configuration, the strength of the rotating body improves in comparison to a rotating body formed by joining two or more wafer placement boards to the driving portion.

The above ion implantation apparatus of the present invention can further adopt a configuration in which the gas evacuation member is a blade made by cutting and erecting a part of the disk-shaped board in the one face, and the through-hole is a hole formed in the cut and erected portion.

With this configuration, by cutting and erecting the gas evacuation member, it is possible to integrally provide the gas evacuation member with the wafer placement board. Thus, the strength of the portion of the gas evacuation member improves in comparison to a rotating body formed by joining another gas evacuation member with the wafer placement board. Also, because the gas evacuation member and the gas discharge path can be formed at the same time, manufacturability of the rotating body increases.

The above ion implantation apparatus of the present invention can further adopt a configuration in which two or more of the through-hole and the blade are concentrically disposed relative to the center of rotation of the disk-shaped plate.

With this configuration, because it is possible to concentrically dispose wafers matching the gas evacuation members, ion beam can be efficiently irradiated to the wafer by driving rotationally, and outgas generated from the wafer can be immediately evacuated.

Also, in this configuration, when the wafers are concentrically disposed, it is possible to more quickly evacuate outgas, and to accurately irradiate the ion beam, and so ion beam irradiation to unused regions (members other than the wafers) is lessened, thus reducing the amount of outgas generated from the constituent members of the vacuum chamber and rotating body.

As explained above, with the present invention, gas such as outgas unavoidably generated from the wafer, outgas generated from the constituent members of the vacuum chamber and rotating body, and residual ambient gas inside the vacuum chamber can be immediately evacuated from the wafer surface. Thus, a marked effect can be obtained in which the generation of wafer crystal defects caused by outgas, the generation of dose shift when performing ion implantation, and the like can be reliably suppressed

BRIEF DESCRIPTION OF THE DRAWINGS

FIG. 33 is a conceptual diagram for illustrating the elevation angle of a gas removal wall face, and is an end view that shows a cross-section along the line A-B in FIG. 1 or a cross-section along the line C-D in FIG. 7.

DESCRIPTION OF THE PREFERRED EMBODIMENTS

The ion implantation apparatus according to the present invention includes a gas evacuation member that has a gas evacuation wall face, and is provided with a structure that quickly and reliably evacuates gas from the vicinity of the surface by causing this gas evacuation wall face to collide with gas present in the vicinity of a semiconductor wafer surface. Following is a description of a preferred embodiment of this sort of ion implantation apparatus according to the present invention.

EMBODIMENT 1

Figure 3:
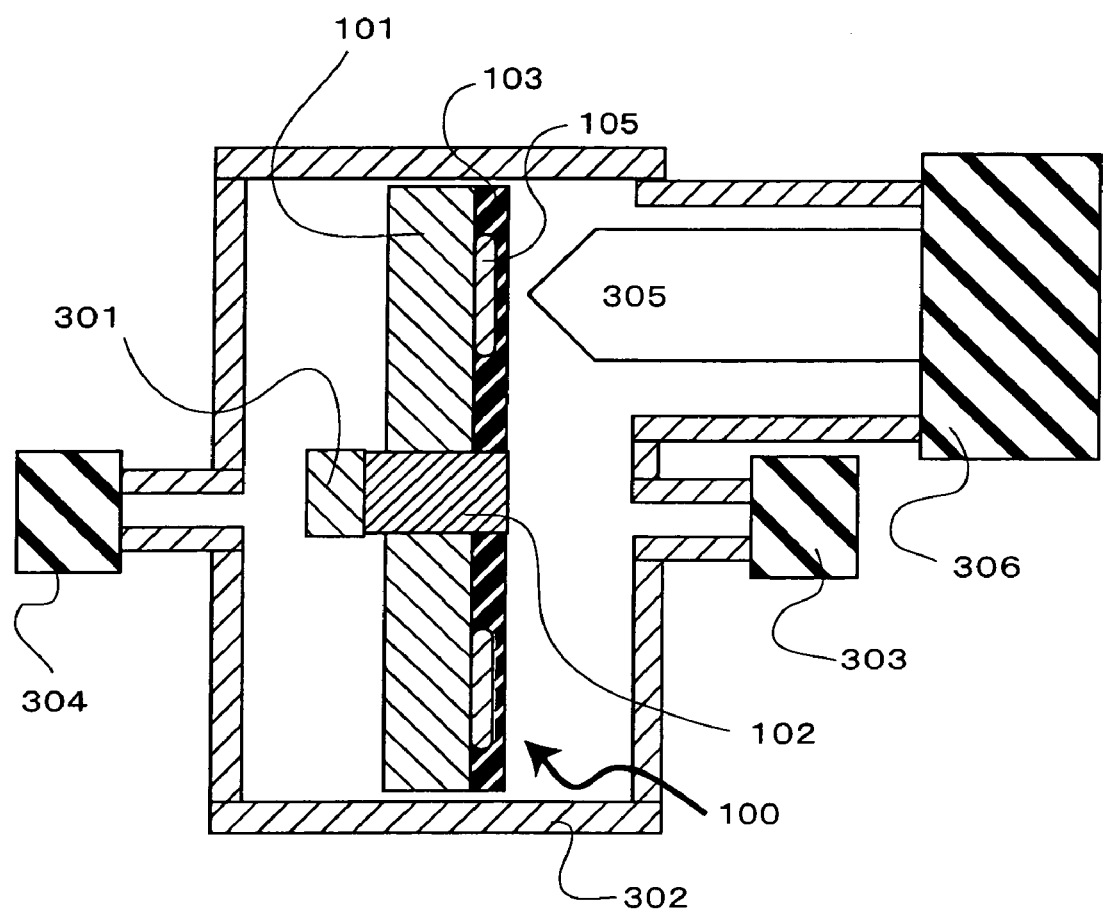
FIG. 3 is a sagittal cross-sectional view of an example of the ion implantation apparatus according to the present invention.

The ion implantation apparatus according to embodiment 1 of the present invention, as shown for example in FIG. 3, includes a rotating body 100 that rotates in a fixed direction, a vacuum chamber 302 that houses this rotating body 100, an ion beam injecting portion 306 that injects an ion beam 305 at a wafer placed on the rotating body, a first pump 303, and a second pump 304. Also, a wafer 105 is shown in the drawings for the sake of convenience, but this wafer 105 is not an essential constituent feature of the ion implantation apparatus according to the present invention.

Following is a description of the rotating body in Embodiment 1 of the present invention with reference to the accompanying drawings, which is a main constituent feature.

Figure 1:
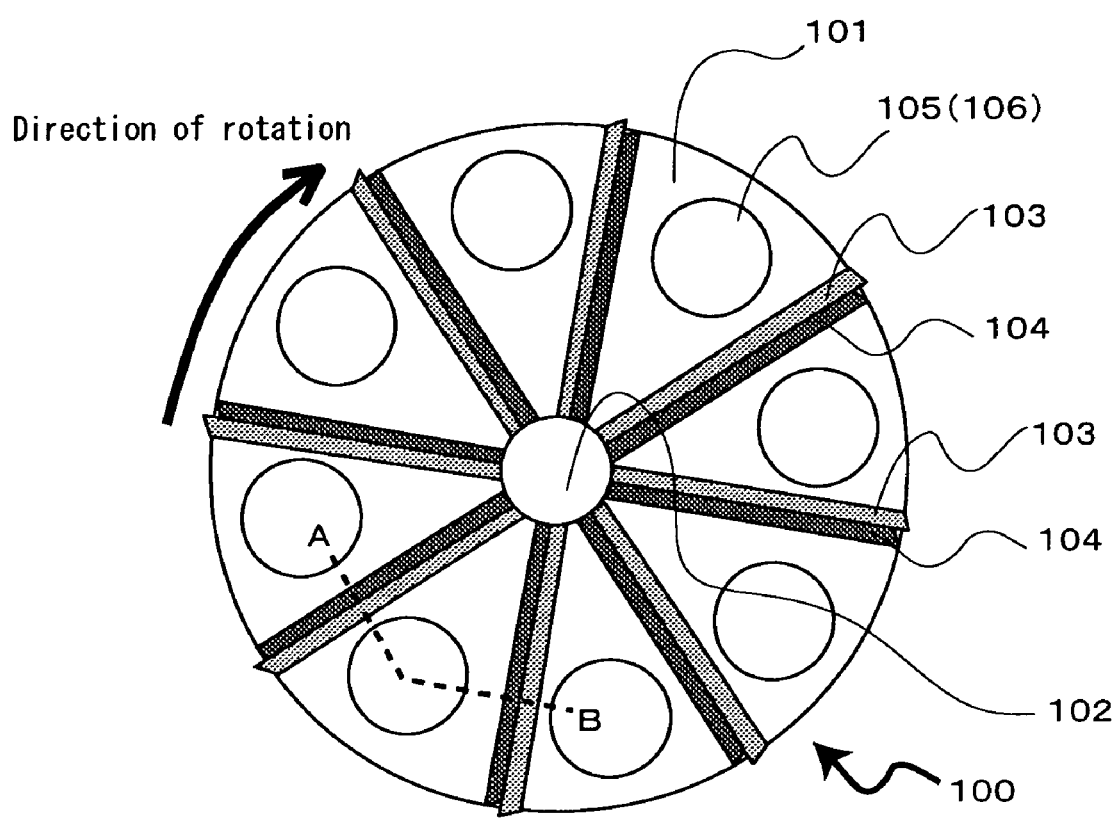
FIG. 1 is a front view that shows an example of a rotating body according to the present invention.
Figure 2:
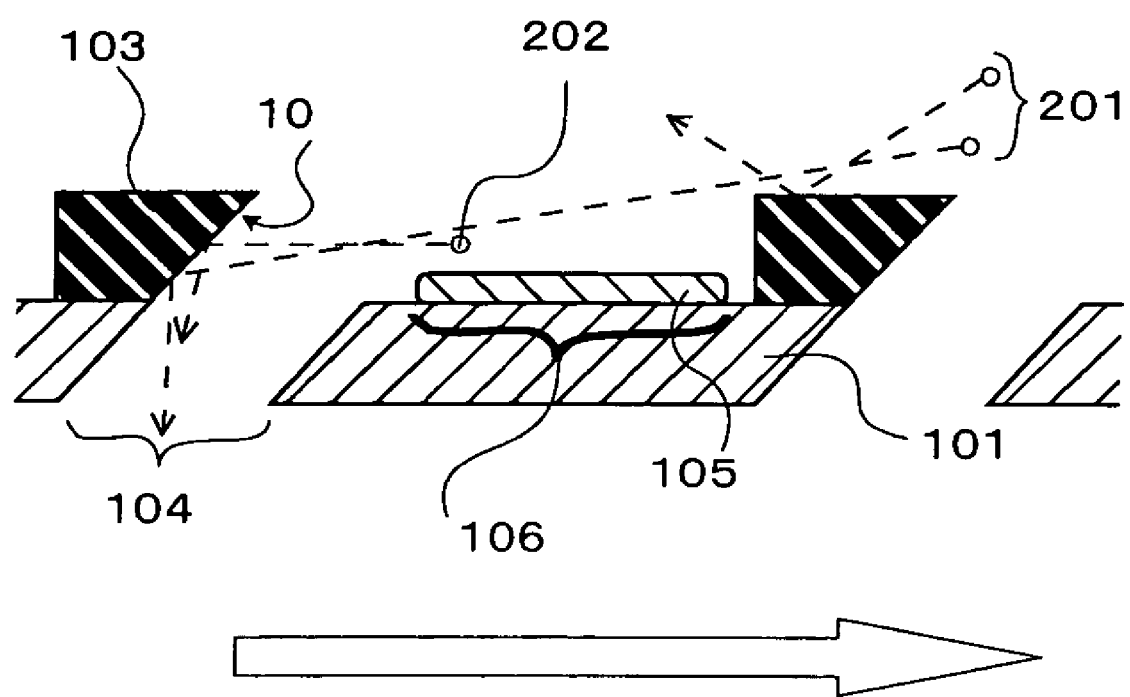
FIG. 2 is an end view that shows an example of a cross section along line A-B in FIG. 1.

FIG. 1 is a front view that shows the rotating body according to Embodiment 1 of the present invention. FIG. 2 is an end view that shows an example of a cross section along line A-B in FIG. 1. Here, the rotating body of this Embodiment 1 has a configuration provided with one or two or more wafer placement boards 101 having a wafer placement face 106 on one side, a gas discharge path 104 for the purpose of discharging gas present on the side of the wafer placement face to the face opposite to the wafer placement face 106, a gas evacuation member 103 provided protruding from one face of the wafer placement board 101, having a first gas evacuation wall face, and a driving portion 102 that rotates the wafer placement board 101. The gas evacuation member 103 is disposed behind the gas discharge path 104 in the direction of rotation, the first wall face 10 of the gas evacuation member 103 is the frontal face in the direction of rotation, and is a curved face or a flat face standing up from the one face, having an angle of elevation greater than 0 degrees and less than 90 degrees when using a plane parallel to the wafer placement face 106 as a level plane.

With this structure, the gas evacuation member 103 is behind the gas discharge path 104 in the direction of rotation, and is provided on the face having the wafer placement face 106 (on one side) having the first wall face 10 of the shape described above, and so when the wafer placement board 101 rotates, the first wall face 10 collides with gas that is present on one side of the wafer placement board 101, and leads the gas to the gas discharge path 104 and therefore the gas is discharged to the face opposite to the one face of the wafer placement board 101. Thus, accumulation of gas on the wafer surface is prevented, and gases such as outgas generated from the wafer, outgas floating in the vacuum chamber, and residual ambient gas are quickly evacuated from the wafer surface.

The gas evacuation member 103 preferably adopts a structure wherein the height from the flat plane including the wafer placement face 106 is higher than the height of the wafer placed on the wafer placement face 106 (thickness). Also, the higher the gas evacuation member 103, the more it is possible to impede a great influx of gas and evacuate, and as long as smooth rotation of the rotating body in the vacuum chamber is not hindered, it is preferable to make the gas evacuation member 103 much taller than the wafer. Because the thickness of the semiconductor wafer to which a dopant is implanted using an ion implantation apparatus is ordinarily about 0.5 mm, the height of the gas evacuation member 103 is preferably more than 0.5 mm, and may more preferably be 1.0 mm or greater. However, because the preferable height of the gas evacuation member 103 is determined relative to the wafer thickness, there may also be instances where good results are obtained with the height of the gas evacuation member being less than 0.5 mm.

Following is a further explanation of the structure of the rotating body. As shown in FIGS. 1 and 2, the rotating body 100 according to this Embodiment 1 adopts a structure with the driving portion 102 as a center of rotation, wherein eight wafer placement boards 101 are radially disposed with constant spacing, and on faces on one side (the upper faces) of the wafer placement boards 101 the wafer placement faces 106 are concentrically provided, and also on that face the gas evacuation members 103 are attached in a state protruding from that face. With this rotating body 100, the spacing between the wafer placement boards 101 becomes the gas discharge path 104.

Further, as shown in FIG. 1 and FIG. 2, the gas evacuation member 103 is disposed behind the gas discharge path 104 in the direction of rotation, and is provided along the frontal end portion of the wafer placement board 101 in the direction of rotation. The first gas evacuation wall face 10 is provided, and as shown in FIG. 2, this first wall face 10 is the frontal face in the direction of rotation, and with a plane parallel to the wafer placement face 106 as a level plane, is a flat face rising from the one face with an angle of elevation of 45 degrees.

Also, the height of the gas evacuation member 103 is 0.5 mm.

The elevation angle of the first wall face, as shown for example in FIG. 33(A), is an angle formed by the first wall face 10 and a plane parallel to the wafer placement face 106, meaning an elevation angle with the parallel plane made a level plane.

Following is a description of an operating method of the ion implantation apparatus according to Embodiment 1 and a method for removing gas from the wafer surface when performing ion injection, using the ion implantation apparatus shown in FIG. 3 as an example.

First, a wafer 105 is prepared wherein a photoresist mask for locally implanting a dopant has been patterned on the wafer surface, and placed on the wafer placement surface 106 of the rotating body 100 in the vacuum chamber 302.

Next, after being placed in the vacuum chamber 302, the driving portion 102 is driven, driving the rotating body 100 so as to be rotated in a fixed direction. In this state an ion beam 305 injected from the ion beam injecting portion 306 is irradiated on the rotational orbit of the wafer.

Figure 5:
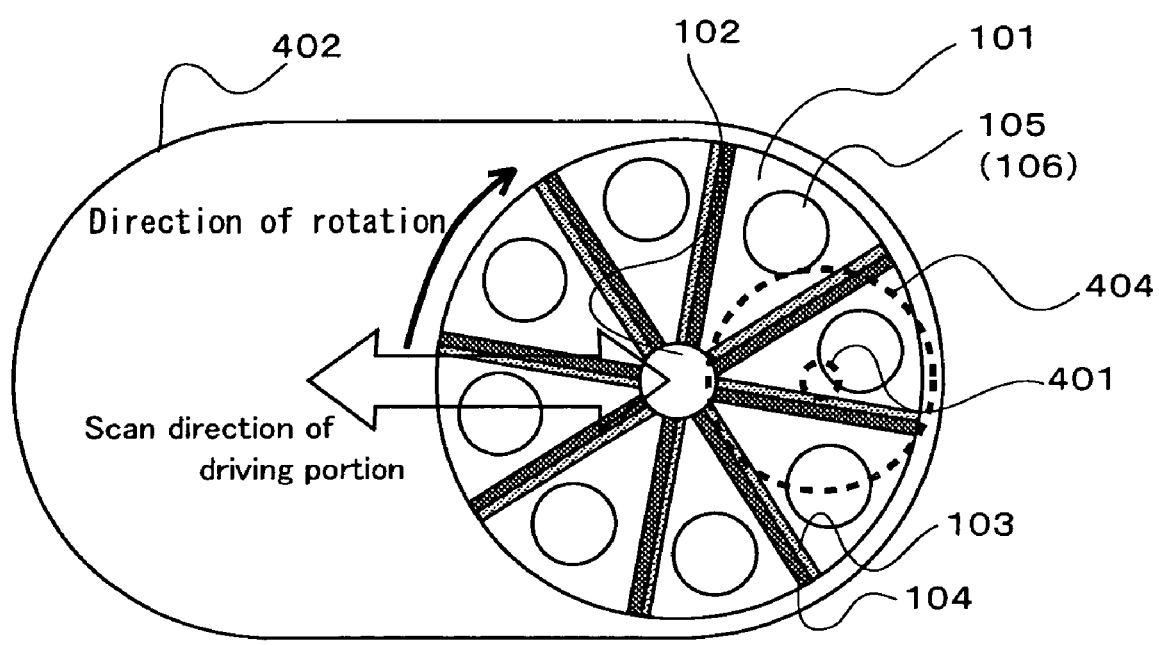
FIG. 5 is a conceptual diagram for illustrating the scan direction of the driving portion in the subchamber of the ion implantation apparatus in FIG. 4.

This ion beam irradiation employed a method in which the ion beam 305 was electrostatically or mechanically scanned in a direction perpendicular to the plane of rotation, and by making the width of the ion beam equal to or greater than the wafer diameter, ions were implanted to the entire face of the wafer 105 without scanning the rotating body 100, but as shown in FIG. 5, it is possible to use an apparatus that allows the surface of the rotating body to be scanned. Also, the dose amount of the implanted ions may be adjusted by a means that controls the current density and irradiation time of the ion beam.

Incidentally, a photoresist is ordinarily masked on the wafer 105, and when the ion beam 305 is irradiated to the wafer 105, the outgas 202 is unavoidably generated from the photoresist, but with the ion implantation apparatus according to this Embodiment 1, because the wafer placement board 101 on which a wafer is placed rotates, the outgas 202 generated from the wafer moves relatively backwards in the direction of rotation, as shown in FIG. 2. Accordingly, this outgas 202 collides with the gas evacuation wall face (the first wall face 10) of the gas evacuation member 103 that is disposed behind the wafer placement face 106 in the direction of rotation.

Here, the first wall face 10 has an elevation angle of 45 degrees relative to a level plane that includes the wafer placement face 106, and the gas discharge path 104 is provided ahead of, in the direction of rotation, the gas evacuation member 103 having the first wall face 10. Accordingly, the first wall face 10 collides with outgas molecules at a 45 degree angle, and biases the outgas molecules downward (toward the wafer placement face) at an angle. Therefore the outgas molecules are led to the entrance to the gas discharge path 104 that is provided on the wafer placement board, and then discharged to the opposite face (rear face) of the wafer placement board 101.

In addition to the outgas 202 generated from the resist, residual ambient gas and outgas driven out from the members constituting the chamber and the rotating body is floating in the vacuum chamber, and as shown in FIG. 2, all of this sort of gas 201 also moves relatively backwards in the direction of rotation with rotation of the wafer placement board 101, and like the outgas 202 is discharged to the rear face of the wafer placement board 101.

On the other hand, of the gas floating in the chamber, although gas that did not collide with the first wall face 10 attempts to fly to the surface of the wafer, its path is obstructed by the gas evacuation member 103 which has a taller rear than the wafer 105, as shown in FIG. 2. Thus, the gas does not reach the wafer 105.

By adopting this sort of configuration, the gas present on the wafer placement face is evacuated upward or to the face opposite to the wafer placement face 106, and so with the ion implantation apparatus according to this Embodiment 1, the accumulation of gas near the surface of the wafer can be prevented. Also, in the case of using a conventional rotating body that does not have a gas evacuation member 103, although the gas temporarily moves backwards in the direction of rotation from the wafer surface along with rotation of the wafer placement face, because rotation is continuous the wafer and the gas meet again, and it is not possible to sufficiently decrease contact between the wafer and the gas molecules. Further, even if the vacuum chamber has been aspirated at all times, it is not possible by this alone to immediately evacuate a small quantity of gas molecules newly generated by ion beam irradiation.

As shown in FIG. 3, with this apparatus, gas discharged to the rear face is discharged from inside the vacuum chamber 302 via a second pump 304 that is opened to the chamber space of the side of the rear face of the wafer placement board 101.

Gas that has moved upward away from the wafer placement board 106 is mainly discharged from inside the vacuum chamber 302 via a first pump 303 that is opened to the chamber space of the side of the wafer placement face. However, the gas that has been moved upward away may also be discharged to the rear face of the wafer placement board 101 via the first wall face 10 and the gas discharge path 104 after being reflected in the vacuum chamber. Thus, the first pump 303 may also not be provided.

Next is a description of a modified example of the rotating body according to the Embodiment 1 described above.

(1) Number of Wafer Placement Boards 101 and their Aggregate Shape

Figure 22:
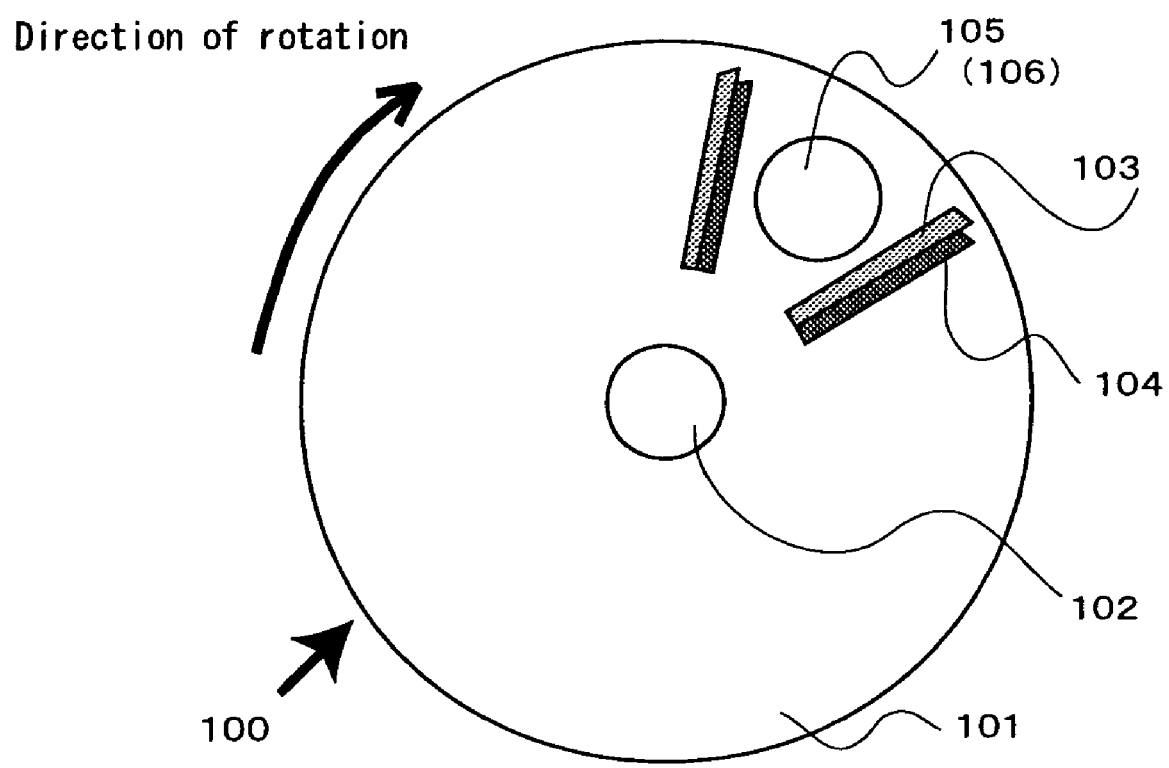
FIG. 22 is a front view that shows another example of a rotating body according to the present invention.

As described above, the number of wafer placement boards 101 can be one or two or more. When adopting a configuration in which there is one wafer placement board 101, for example, a propeller-shaped structure may be adopted in which the wafer placement board 101 is provided in a staff portion of the columnar driving portion 102 as shown in FIG. 18(B1), or as shown in FIG. 19(B) a tree-shaped structure may be adopted in which the wafer placement board 101 is provided at the branch end of the driving portion 102 having one branch (arm), or as shown in FIG. 20 or FIG. 22, a structure may be adopted in which the wafer placement board 101 is made of one disk-shaped board, and the driving portion 102 is provided in the center of rotation of the disk-shaped board.

Figure 18:
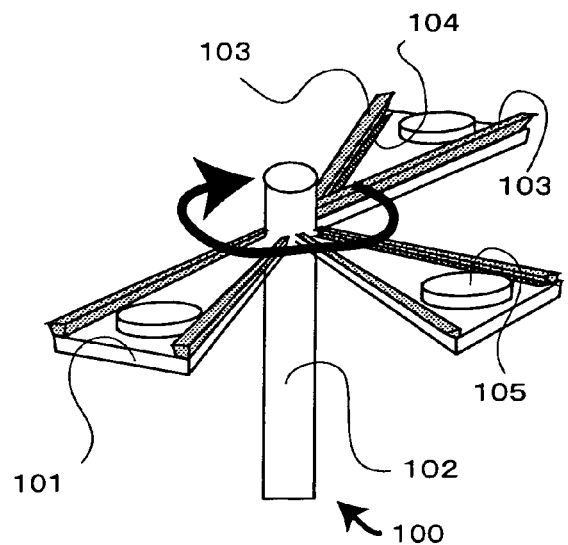
FIG. 18 is a perspective view that shows another example of a rotating body according to the present invention.
Figure 18:
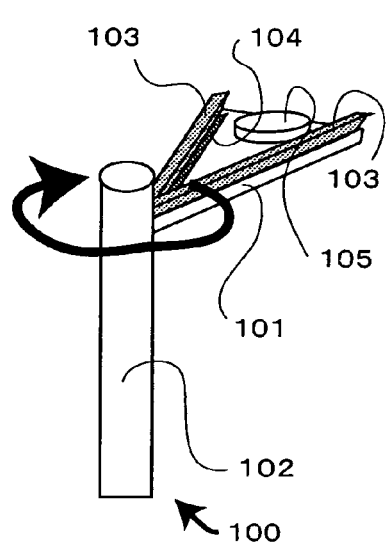
Figure 18:
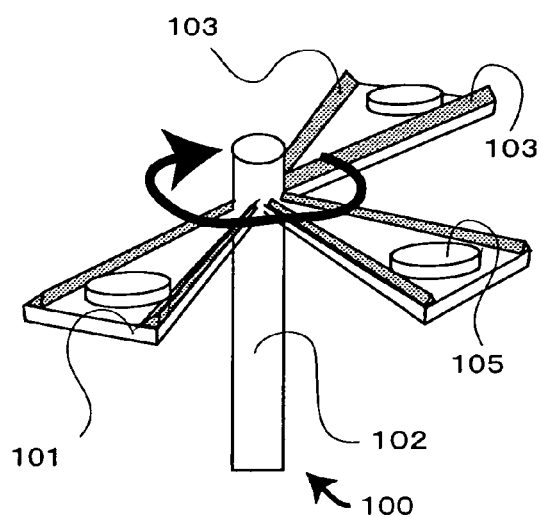
Figure 18:
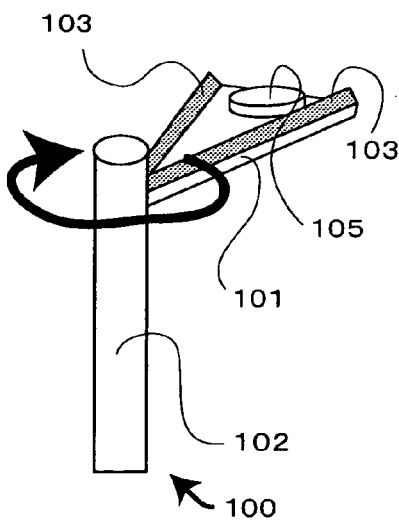
Figure 19:
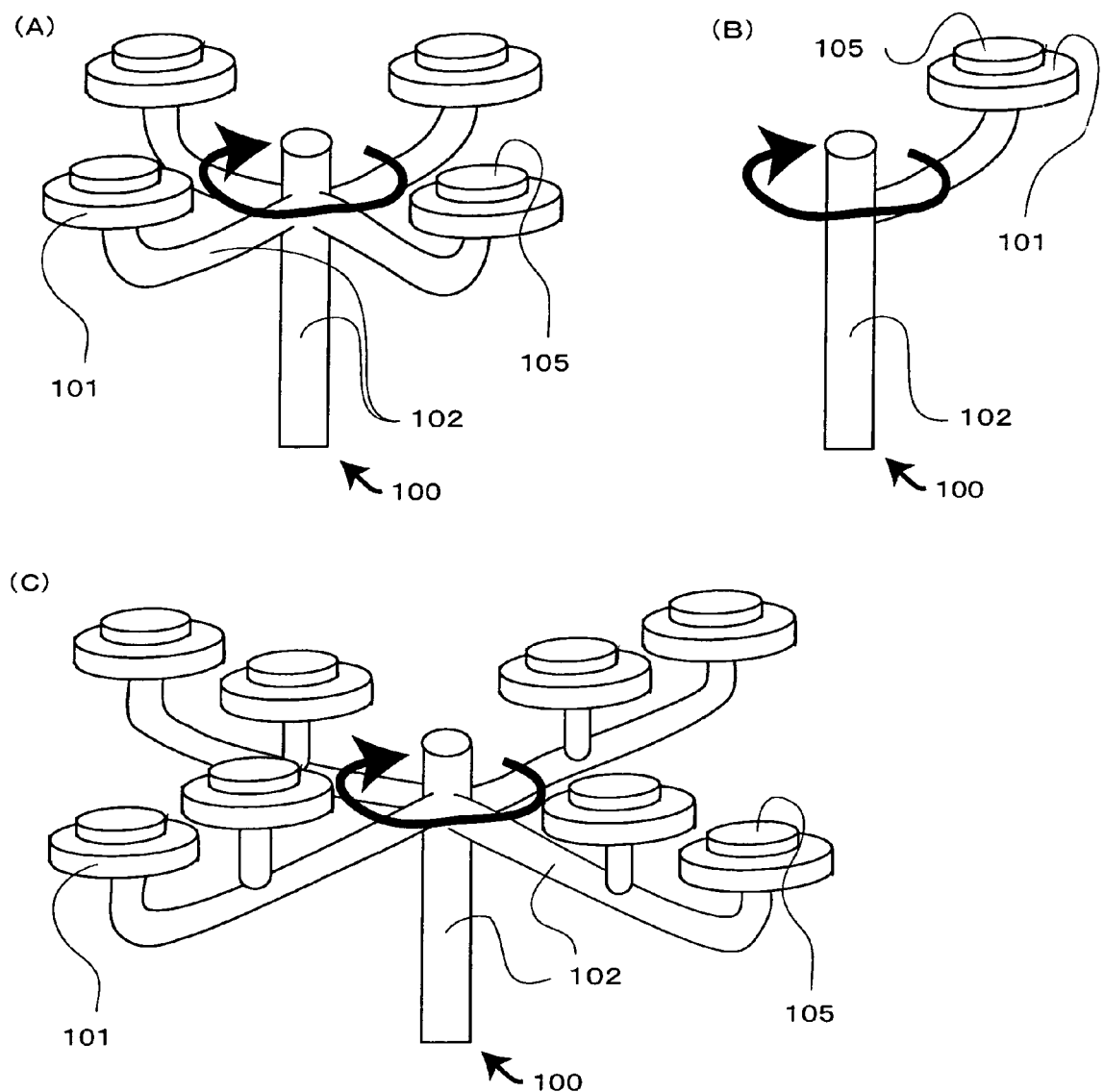
FIG. 19 is a perspective view that shows yet another example of a rotating body according to the present invention.
Figure 20:
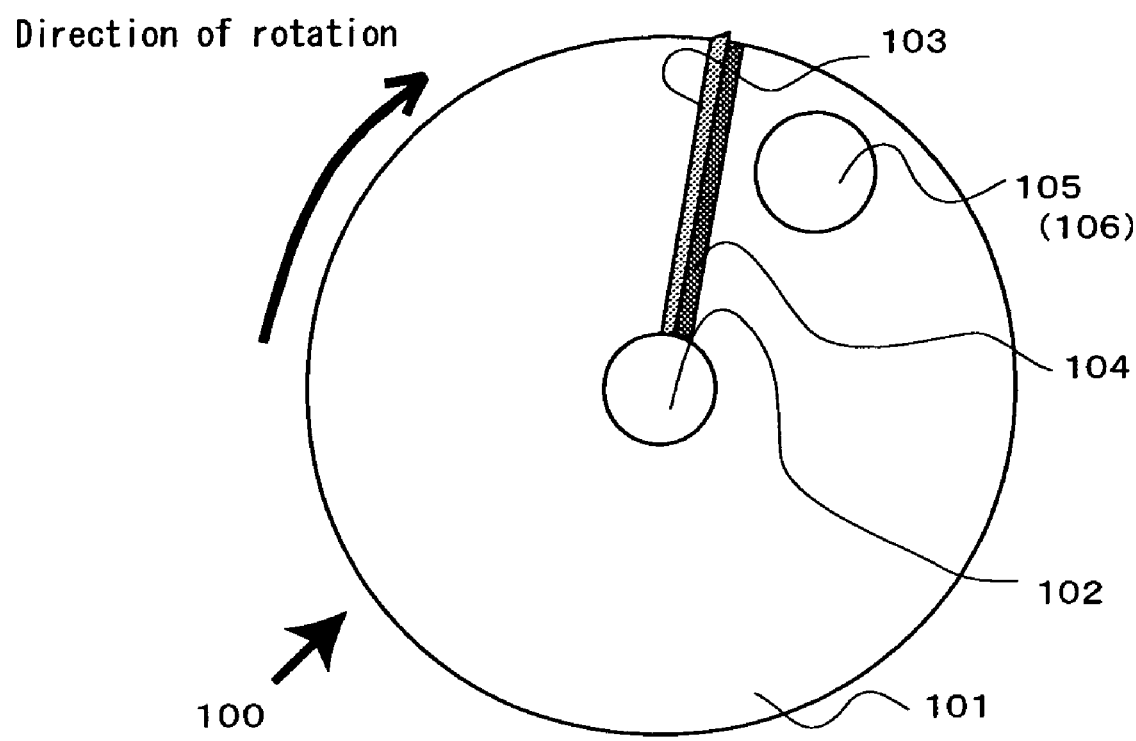
FIG. 20 is a front view that shows still another example of a rotating body according to the present invention.

In order to simplify the figures, in a part of FIG. 18 and in FIG. 19 the gas evacuation member 103 and the gas discharge path 104 are not shown, but as described above, it is necessary to provide the gas discharge path 104 ahead of the gas evacuation member 103 in the direction of rotation. Therefore, when the gas evacuation member 103 is not provided in the frontal end portion of the wafer placement board 101 in the direction of rotation, as shown for example in FIG. 18(B1), FIG. 20, and FIG. 22, it is possible to provide the gas discharge path 104 ahead of the gas evacuation member 103 in the direction of rotation by forming a through-hole cut in at least a part of the wafer placement board 101.

Also, when the gas evacuation member 103 is provided in the frontal end of the wafer placement board 101 in the direction of rotation, it is not particularly necessary to provide a hole cutting through a part of the wafer placement board 101, and as shown for example in FIG. 18(B1), it is possible to use the frontal space, in the direction of rotation, of the wafer placement board 101 as the gas discharge path 104.

Figure 21:
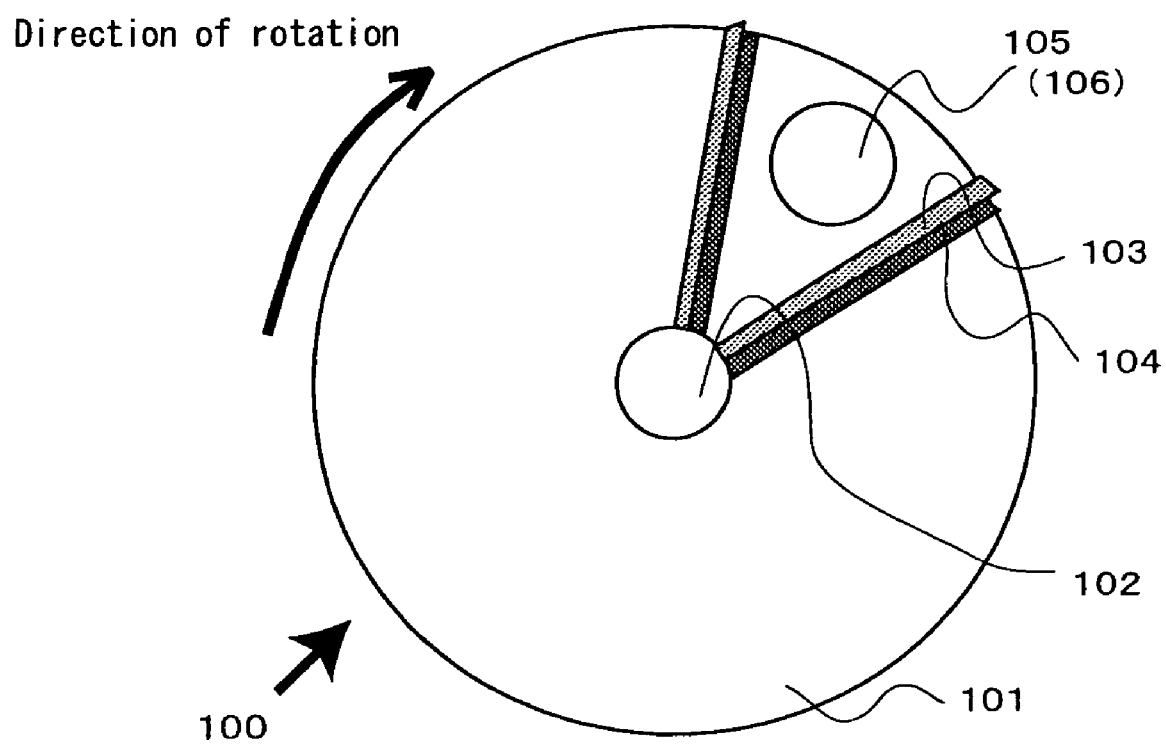
FIG. 21 is a front view that shows another example of a rotating body according to the present invention.

When adopting a configuration in which there are two or more wafer placement boards 101 that are rotated by the driving portion 102, for example, a propeller-shaped structure may be adopted in which three wafer placement boards 101 are provided in a staff portion of the columnar driving portion 102 as shown in FIG. 18(A1), or as shown in FIG. 19(A) or (C) a tree-shaped structure may be adopted in which four or eight wafer placement boards 101 are provided at the branch ends of the driving portion 102 having a four or eight-branch structure, or as shown in FIG. 21, a disk-shaped structure may be adopted in which two fan-shaped wafer placement boards 101 in a shape dividing the disk into two are assembled with a predetermined spacing in the staff portion of the columnar driving portion 102.

The gas discharge path 104 may use the spacing between two or more wafer placement boards 101, and when adopting this structure, there is the advantage that by changing the size and assembled number of wafer placement boards 101, the spacing between wafer placement boards can be conveniently adjusted.

The rotating body 100 may constitute a disk-shaped structure in which two or more wafer placement boards 101 are radially arranged with the driving portion as a center of rotation, or in which the wafer placement board 101 is one disk-shaped board, and the driving portion is provided in the center of rotation of the disk-shaped board.

When adopting a structure in which a plurality of wafer placement boards 101 are disposed in a disk shape, it is possible to eliminate degradation of rotational drivability and increase the loading area. On the other hand, when adopting a configuration in which the wafer placement board 101 constitutes one disk-shaped board, it is possible to make a rotating body with greater strength than one which is assembled from a plurality of wafer placement boards, and it is possible to increase the shield factor of vertical space divided by the wafer placement board.

To further increase the shield factor of vertical space divided by the wafer placement board, it is preferable to make the rotating body disk-shaped, and adopt a configuration in which the outer circumference of the rotating body and the inner wall of the vacuum chamber are allowed to be sufficiently close, and in consideration of smooth rotation of the rotating body and the ease of providing the rotating body in the vacuum chamber, it is good to make the space between the outer circumference of the rotating body and the inner wall of the vacuum chamber about 0.5 to 50 mm.

(2) Shape of the First Wall Face

The first wall face 10 of the gas evacuation member 103 is the frontal face in the direction of rotation, and may stand up from the one face with an angle of elevation greater than zero degrees and less than 90 degrees, when making a plane parallel to the one face having the wafer placement face 106 a level plane, and is not restricted to a flat-shaped wall face as shown in FIG. 2 or in FIG. 33(A). For example, it is possible to make the first wall face 10 a curved face as shown in FIG. 33(B). Also, the first wall face 10 may have an uneven surface as long as it is possible to lead collided gas to the gas discharge path 104.

The reason that the first wall face 10 adopts a face with an elevation angle less than 90 degrees is as described next. When the angle of elevation is 90 degrees, the outgas and the wall face collide head-on, and so the movement of the gas molecules becomes a direction parallel to the direction of rotation. Also, the gas molecules may be led to the wafer surface, depending on the approach angle of the gas molecules. Thus, it is not possible to reduce the likelihood of contact between the gas molecules and the wafer. On the other hand, when the angle of elevation is greater than 90 degrees, repulsive force acts on the gas molecules in the upward direction, and therefore the gas molecules can not be led to the gas discharge path. On the other hand, when the angle of elevation of the wall face 10 is 0 degrees, naturally the effect of leading the gas molecules can not be obtained at all. Thus, the angle of elevation of the first wall face 10 must be less than 90 degrees and greater than 0 degrees.

(3) Overall Shape and Arrangement of the Gas Evacuation Member

The gas evacuation member 103 is disposed behind the gas discharge path 104 in the direction of rotation, and the first wall face 10 of the gas evacuation member 103 is the frontal face in the direction of rotation, and has a structure in which it is a curved face or a flat face standing up from the one face, having an angle of elevation greater than zero degrees and less than 90 degrees where a plane parallel to one face having the wafer placement face 106 is a level plane. As the shape of the gas evacuation member 103, as long as it includes at least the first wall face 10, the operation described above can be obtained, and so the shape is not restricted to the square structure shown in FIG. 2. For example, the plate-shaped structure having the first wall face 10 shown in FIG. 30(A) may also be adopted.

Figure 12:
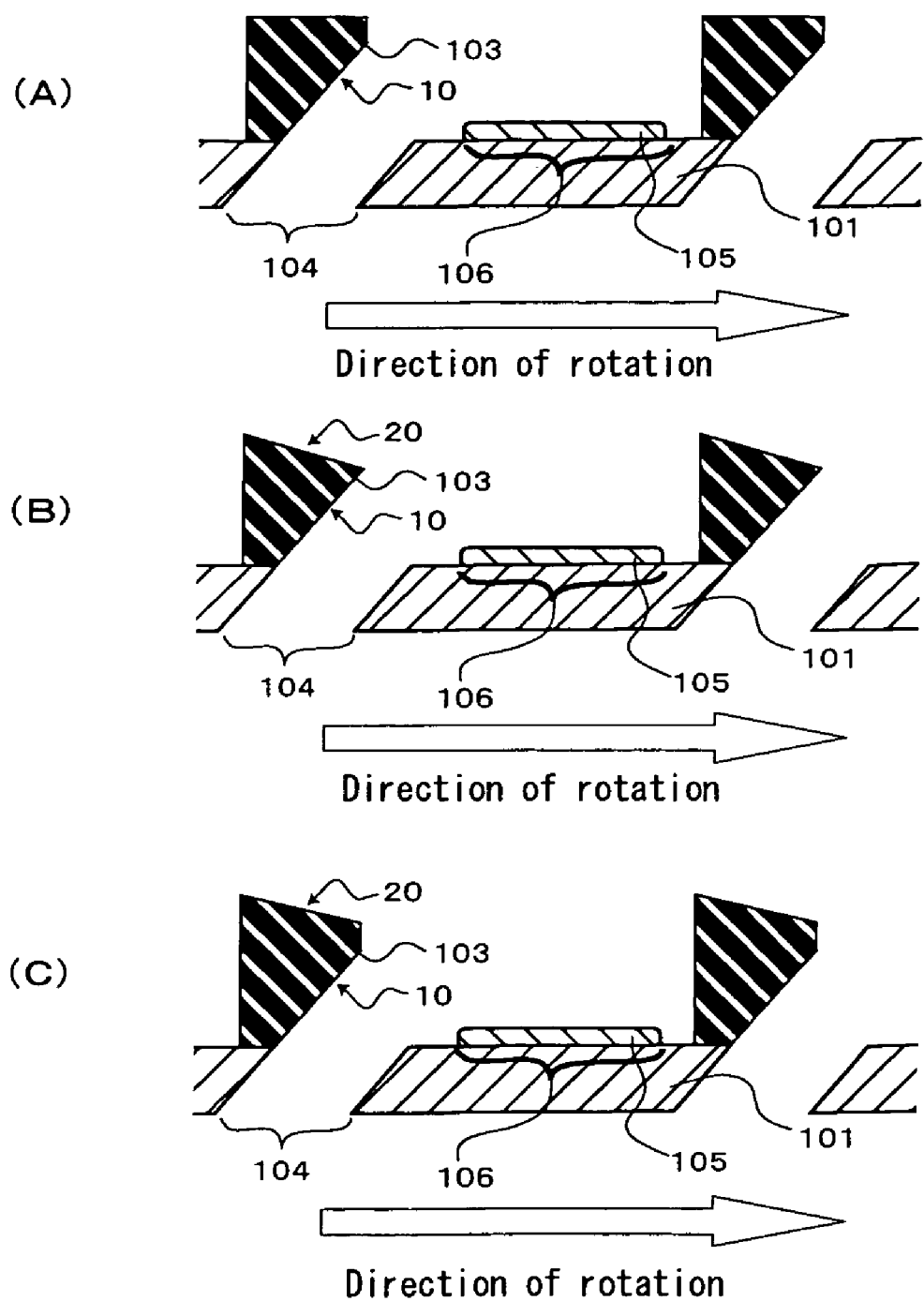
FIG. 12 is an end view that shows still another example of a cross-section along the line A-B in FIG. 1.
Figure 15:
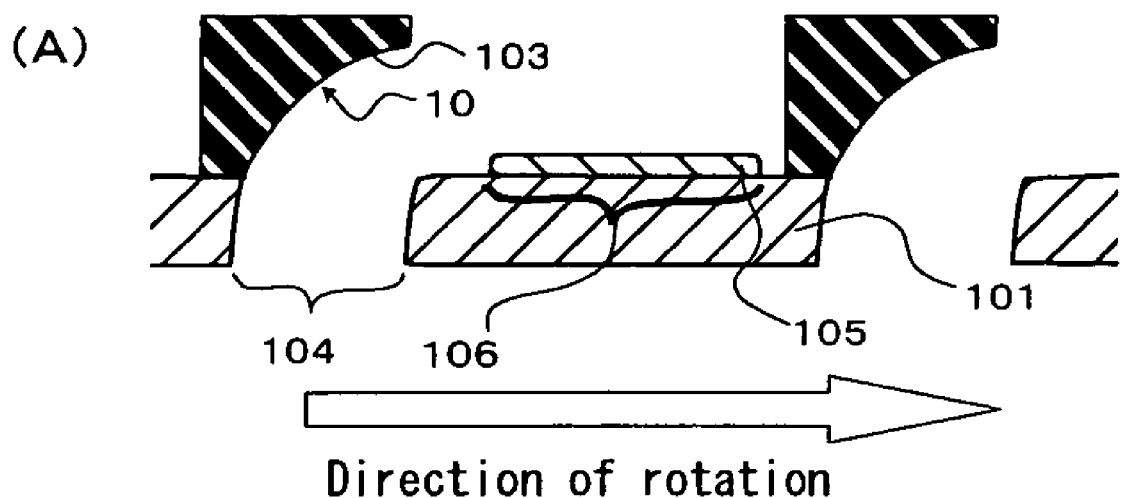
FIG. 15 is an end view that shows still another example of a cross-section along the line A-B in FIG. 1.
Figure 15:
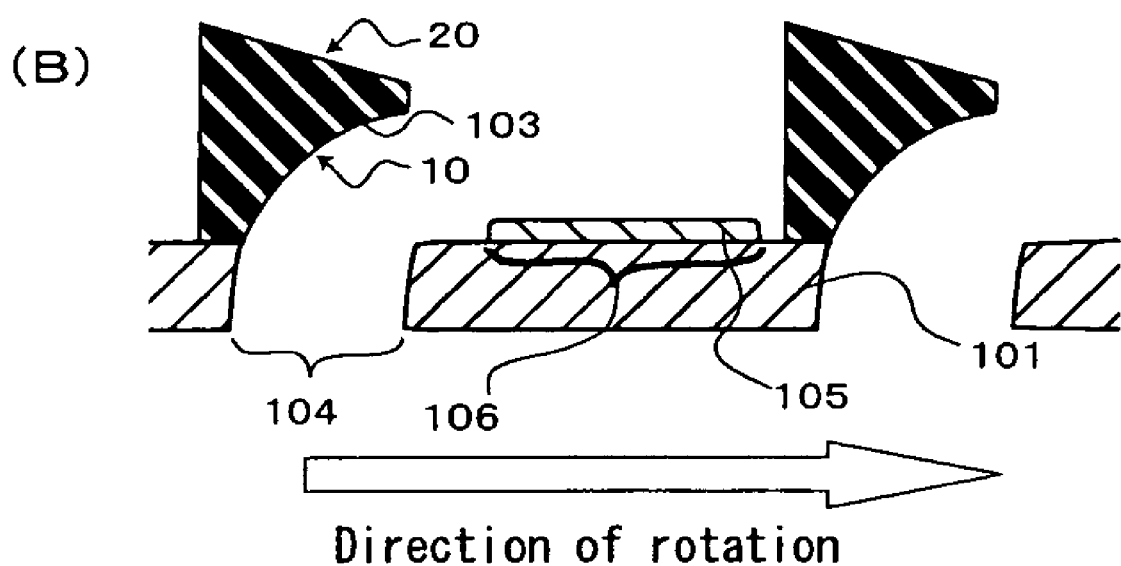
Figure 16:
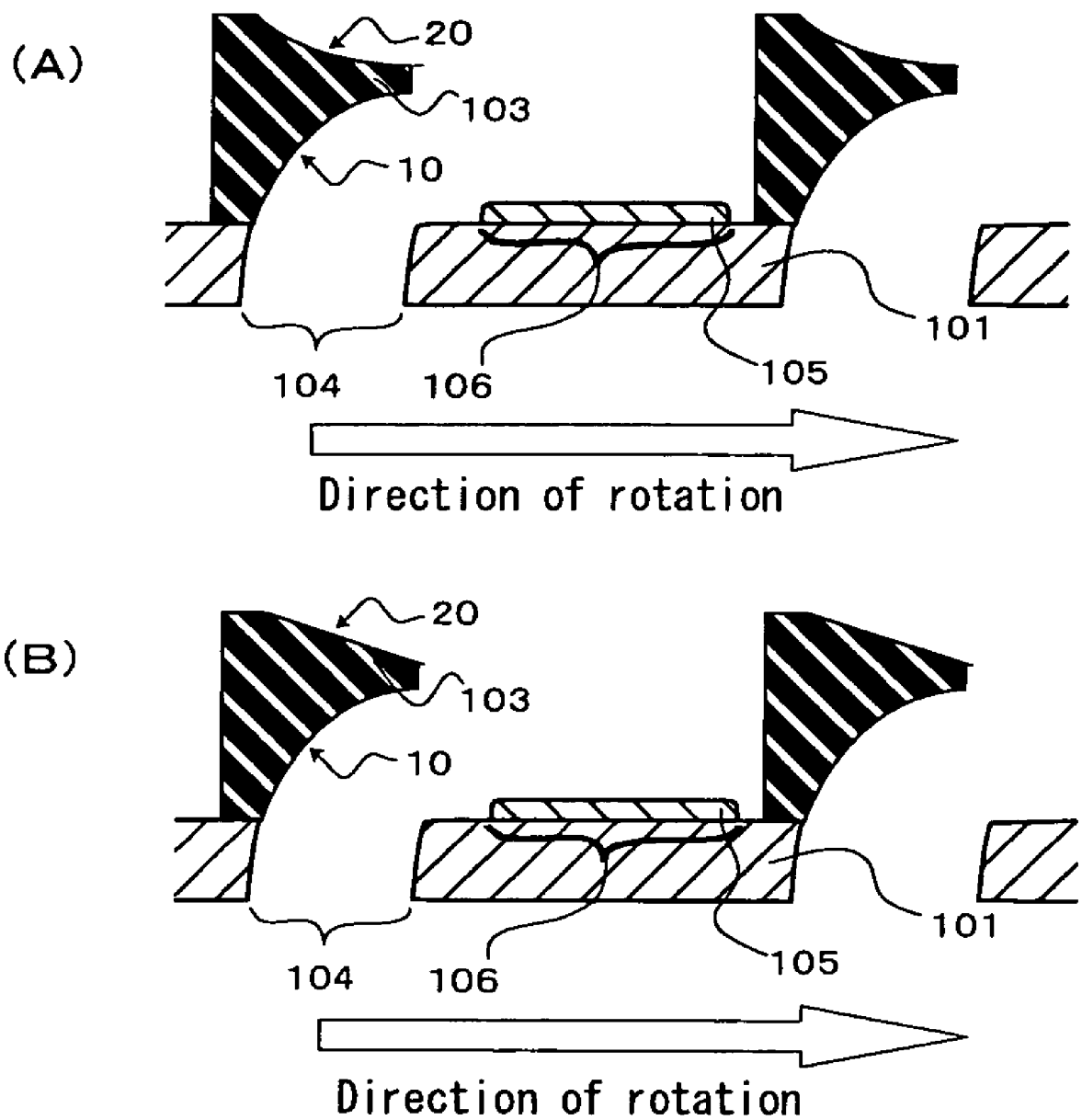
FIG. 16 is an end view that shows another example of a cross-section along the line A-B in FIG. 1.

Also, as shown for example in FIG. 12(A) or FIG. 15(A), the gas evacuation member 103 may adopt a shape having, on the front in the direction of rotation, a face with an angle of elevation of 90 degrees continuing from the first wall face 10. With this shape, because this plane and the first wall face 10 intersect at an obtuse angle greater than 90 degrees, it is more difficult for the intersecting portion to worsen than when intersecting at an acute angle (less than 90 degrees). However, because the gas molecules that collide with this face receive repulsive force in the direction such as that parallel to the direction of rotation, it is preferable to keep this face to a moderate degree of narrowness. A shape having a top face with an angle of elevation greater than 90 degrees as shown in FIG. 12(B) will be explained in Embodiment 2.

Further, the gas evacuation member 103 may adopt a structure in which it is provided integrally molded with the wafer placement board 101, and may also adopt a structure in which various independent members are combined. For example, when the wafer placement board 101 is disk-shaped, a blade preferably is provided by cutting and erecting part of this disk-shaped board in the one face, and the through-hole formed in this cut and erected portion made the gas evacuation member 103. With this structure, by cutting and erecting the gas evacuation member 103, it is possible to integrally provide the gas evacuation member 103 with the wafer placement board 101, and so it becomes easy to lighten the rotating body and there is good manufacturability. With this sort of integrally provided structure, the strength of the erected portion of the gas evacuation member 103 increases.

On the other hand, with a structure in which various independent members are combined in a removable state, it is possible to make the gas evacuation member 103 and the wafer placement board 101 removable, and so it becomes easy to clean the rotating body or replace a deteriorated gas evacuation member 103. Thus, it is possible to realize an apparatus with good maintainability.

(4) Height of the Gas Evacuation Member

The greater the height of the gas evacuation member 103 from a flat plane including the wafer placement face 106, the more it is possible to impede a great influx of gas. Accordingly, it is preferable to adopt a structure wherein the gas evacuation member 103 is much taller than the thickness of the wafer to be placed. However, when the height of the gas evacuation member 103 is made too tall, smooth rotation of the rotating body inside the vacuum chamber is hindered, and so it is necessary to adopt an appropriate height. Ordinarily, optimal values for the rotational speed of the rotating body (angular velocity), the size of the wafer placed, the distance from the center of rotation to the wafer, the attractive force of the pump opened into the vacuum chamber, and the like are set as parameters. Usually, the thickness of a semiconductor wafer to which a dopant is implanted using this type of ion implantation apparatus is about 0.5 mm, and so it is preferable for the height of the gas evacuation member 103 to be greater than 0.5 mm, and more preferably greater than 1.0 mm.

As described above, it is preferable for the top face of this gas evacuation member 103 to be consecutive with the first wall face 10. In this Embodiment 1, as shown in FIG. 2, the top face is parallel to the wafer placement face 106, and because the top face is in continuity with the first wall face 10, the height of the first wall face 10 and the height of the gas evacuating member 103 are the same.

(5) Space between the Rotating Body and the Inner Wall of the Vacuum Chamber

In order to increase the usage efficiency of the housing space in the vacuum chamber, the outer circumference of the gas evacuation member 103 and the inner wall of the vacuum chamber may be close, but when considering smooth rotation of the rotating body and necessary space for disposing the rotating body inside the vacuum chamber, it is preferable that the space between the outer circumference of the gas evacuation member 103 and the inner wall of the vacuum chamber be about 0.5 to 50 mm.

Figure 9:
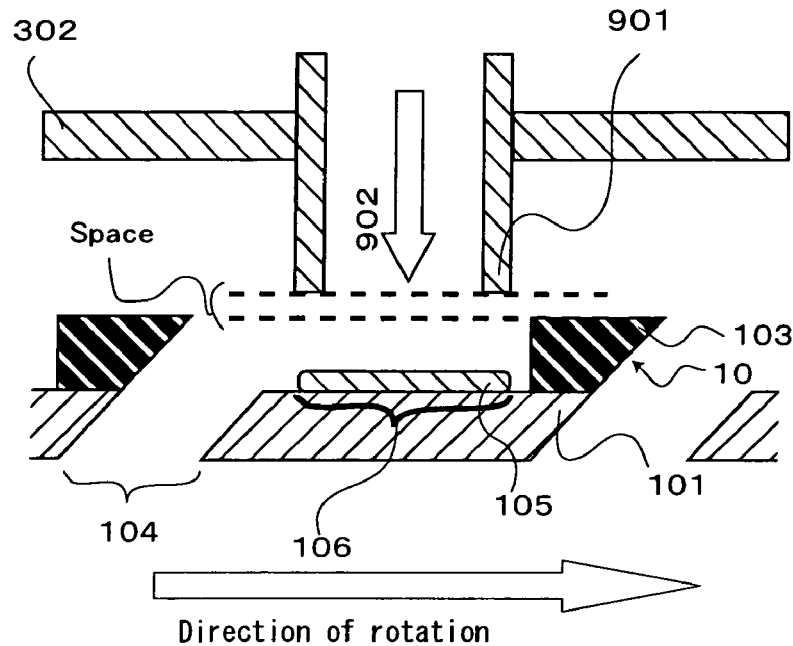
FIG. 9 is a conceptual diagram for illustrating the arrangement of the rotating body in the vacuum chamber of the ion implantation apparatus according to the present invention.
Figure 9:
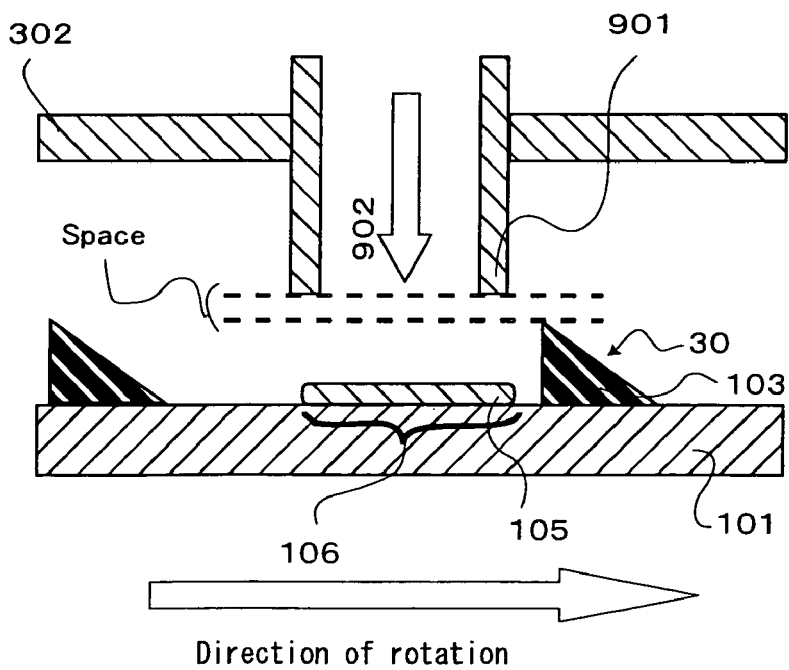

As shown in FIG. 9(A), when the end of a beam line chamber 901 that injects an ion beam 902 protrudes into a vacuum chamber 302, for the same reason, the space between the outer circumference of the gas evacuation chamber 103 and the end of the beam line chamber 901 is made to be 0.5 to 50 mm.

(6) Arrangement of the Gas Evacuation Member Relative to the Center of Rotation

When locally implanting an impurity dopant in a semiconductor wafer, a photoresist mask is executed on the wafer surface, and an ion beam is irradiated from above. Thus, when the ion beam has been irradiated, outgas is unavoidably generated from the photoresist mask. That is, the main gas covering the vicinity of the wafer surface is outgas generated from the wafer, and so it is important to dispose the gas evacuation member 103 is a position where it is possible to quickly evacuate the outgas from the wafer surface. To effectively evacuate this outgas 202, as shown for example in FIG. 20, it is preferable to provide this gas evacuation member 103 behind the wafer placement face 106 in the direction of rotation. This is because when the gas evacuation member 103 has been provided in this position, the outgas 202 collides with the first wall face 10 of the gas evacuation member 103 immediately after being generated, and so the outgas 202 can be quickly evacuated from the wafer surface at the same time that it is generated.

To more surely prevent the accumulation of gas on the wafer surface, as shown for example in FIG. 18(A1), FIG. 18(B1), FIG. 21, and FIG. 22, it is more preferable for still another gas evacuation member 103 to be provided ahead the wafer placement face 106 in the direction of rotation. That is, it is more preferable to adopt a configuration in which gas evacuation members 103 are provided ahead of and behind the wafer 105 in the direction of rotation. A reason for this is that, as described above, by disposing the gas evacuation member 103 ahead of the wafer in the direction of rotation, it is possible to prevent the influx of the floating outgas 201, which is present inside the vacuum chamber in addition to the outgas 202 generated from the resist, to the wafer surface.

This Embodiment 1 has a structure in which the gas discharge path 104 and the gas evacuation member 103 are provided as a pair, it is necessary that gas discharge paths 104 be provided ahead of the respective gas evacuation members 103 in the direction of rotation, but as shown for example in FIG. 18(A1), FIG. 18(B1), FIG. 20, and FIG. 22, a through-hole is formed by notching a part of the wafer placement board 101 ahead of the gas evacuation member 103 in the direction of rotation, and this may be adopted as the gas discharge path. Also, as shown for example in FIG. 18(A1) and FIG. 18(B1), it is possible to use the frontal space of, in the direction of rotation, the wafer placement board 101 as the gas discharge path 104.

A structure is preferable in which two or more of these gas evacuation members 103 are concentrically disposed relative to the center of rotation of the rotating body, and with this structure, because two or more gas evacuation members 103 are concentrically disposed, it is possible to concentrically dispose the wafers. When the wafers are concentrically disposed in this manner, in comparison to when not doing so, rotational movement becomes smoother, and the irradiation width of the ion beam can be narrowed, so an effect is obtained in which it is possible to suppress the absolute amount of outgas given off from the constituent members of the vacuum chamber and the rotating body.

Also, when two or more gas evacuation members 103 are concentrically disposed, it becomes easier to balance the distribution of mass of the rotating body relative to the center of rotation, and so as shown for example in FIG. 1, it is preferable to equally dispose the gas evacuation members 103. When they are disposed in this manner, rotational movement of the wafer placement board 101 becomes smoother, and it is easier to make the irradiation quantity (ion implantation quantity) of the ion beam for each of the placed wafers uniform. Thus, the production yield of the semiconductors improves. However, as shown for example in FIG. 21 and FIG. 22, it goes without saying that it is also possible to adopt a structure in which the evacuation members are disposed in positions that are not axially symmetrical relative to the center of rotation.

(7) Disposition of the Gas Evacuation Member Relative to the Gas Discharge Path

Figure 11:
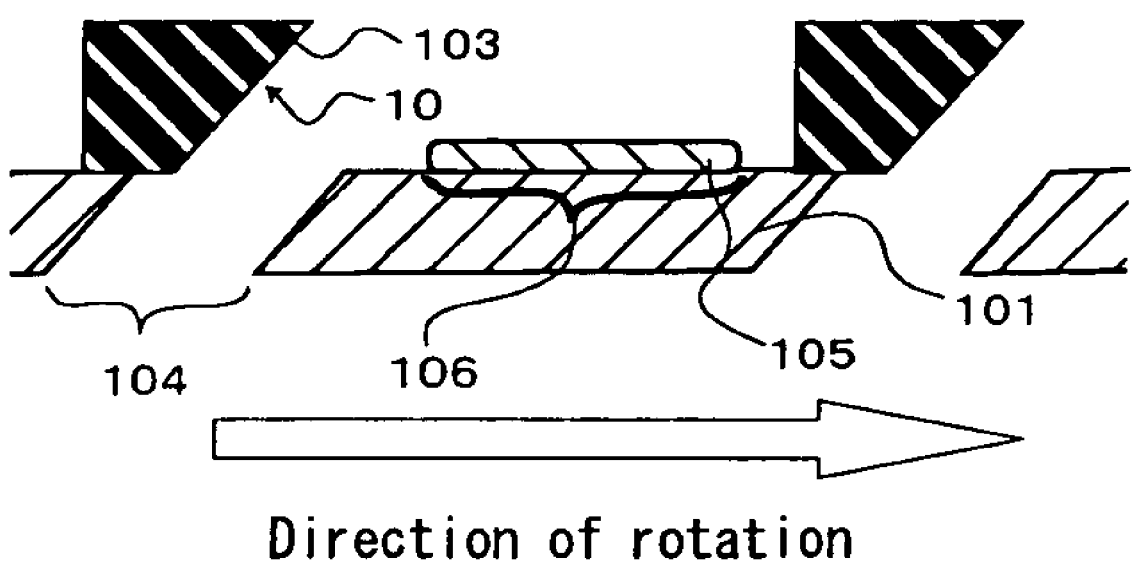
FIG. 11 is an end view that shows yet another example of a cross-section along the line A-B in FIG. 1.

A configuration can be adopted in which this gas evacuation member 103 is disposed behind the gas discharge path 104 in the direction of rotation, and as long as gas that has collided with the first wall face 10 is discharged from the discharge path, it is not restricted to the configuration shown in FIG. 2, in which the first wall face 10 of the gas evacuation member 103 and the passage wall face of the gas discharge path are disposed to be continuous. As shown for example in FIG. 11, a configuration may also be adopted in which the bottom face of the gas evacuation member 103 and the passage wall face of the gas evacuation path are disposed offset from one another.

In the gas discharge path 104, the shape of the passage wall face is not particularly restricted as long as gas that has collided with the first wall face 10 can be discharged to the rear face of the wafer placement board 101. The shape shown for example in FIGS. 10(A) to (D) may be adopted, or a curved face may be adopted. However, the frontal wall face of, in the direction of rotation, the gas discharge path 104 preferably has an angle of elevation that is greater than 90 degrees and less than 180 degrees, when a plane parallel to the wafer placement face 106 is used as a level plane. This is because when the angle of elevation is less than 90 degrees, gas that has entered the gas discharge path 104 receives repulsive force such that it is pushed back towards the wafer placement face.

Figure 10:
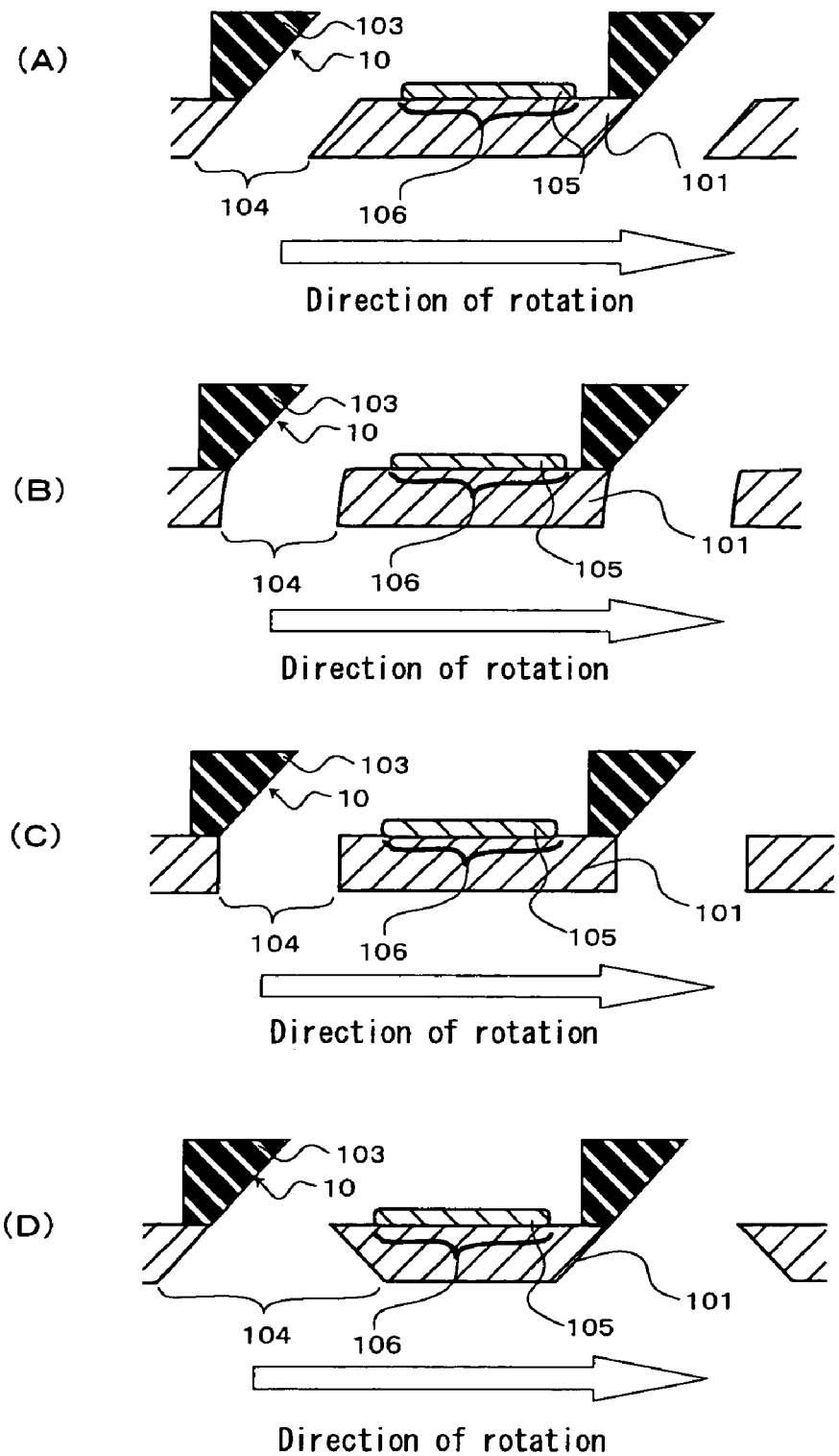
FIG. 10 is an end view that shows another example of a cross-section along the line A-B in FIG. 1.

Also, a structure may be adopted in which, as shown for example in FIG. 10(D), the rear wall face of the gas discharge path 104 in the direction of rotation has an angle of elevation that is greater than 90 degrees and less than 180 degrees, when a plane parallel to the wafer placement face 106 is used as a level plane. This is because with this structure, it is difficult for the discharge of gas to be hindered. However, the invention is not limited to this structure, and as long as gas that has collided with the first gas evacuation wall face 10 is smoothly discharged to the back face of the wafer placement board 101, a structure may be adopted that has an angle of elevation greater than 0 degrees and less than 180 degrees relative to the reference plane described above.

EMBODIMENT 2

This Embodiment 2 differs from the Embodiment 1 described above in that the gas evacuation member has a first wall face 10 and a second wall face for gas evacuation. More specifically, in the gas evacuation member according to Embodiment 2, the gas evacuation member 103 of Embodiment 1 further has a second gas evacuation wall face 20 that is a face other than the first wall face 10, and is a frontal face in the direction of rotation and is constituted by a curved face or a flat face having an angle of elevation greater than 90 degrees and less than 180 degrees when a plane parallel to the wafer placement face 106 is used as a level plane.

Following is a further explanation of a rotating body in which the gas evacuation member 103 having this sort of second wall face 20 is disposed. Items that are the same as in above Embodiment 1 are omitted from the explanation below.

The second wall face 20 of the gas evacuation member 103 according to Embodiment 2 constitutes a curved face or a flat face having an angle of elevation greater than 90 degrees and less than 180 degrees when a plane parallel to the wafer placement face (one face) provided with the gas evacuation member is used as a level plane. Specifically, a flat face as shown for example in FIG. 12(B), FIG. 14(B), FIG. 30(B), or FIG. 31(C), or a curved face as shown for example in FIG. 13(A), FIG. 14(C), FIG. 30(C), or FIG. 31(B) is used.

Figure 30:
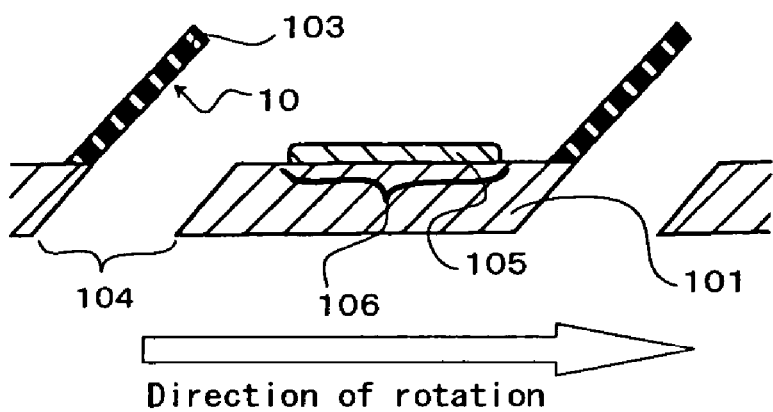
FIG. 30 is an end view that shows another example of a cross-section along the line A-B in FIG. 1.
Figure 30:
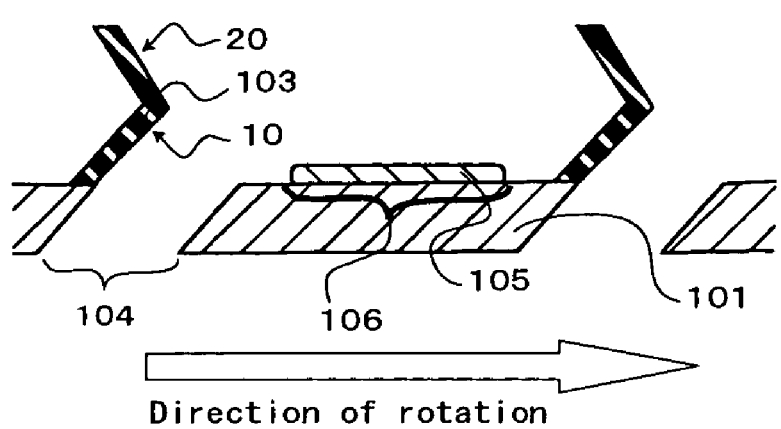
Figure 30:
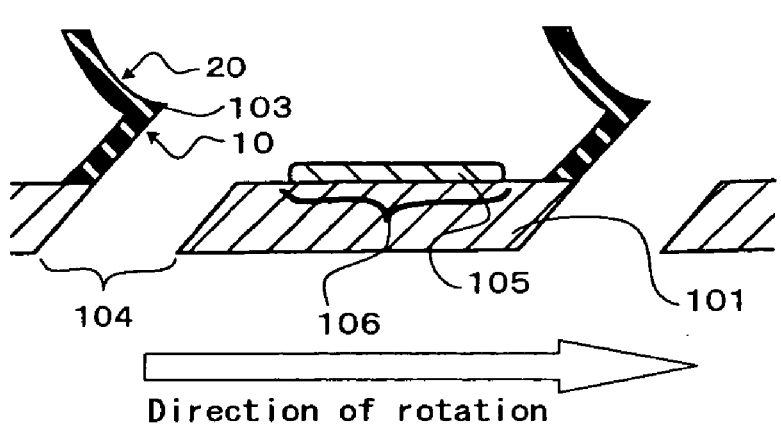
Figure 31:
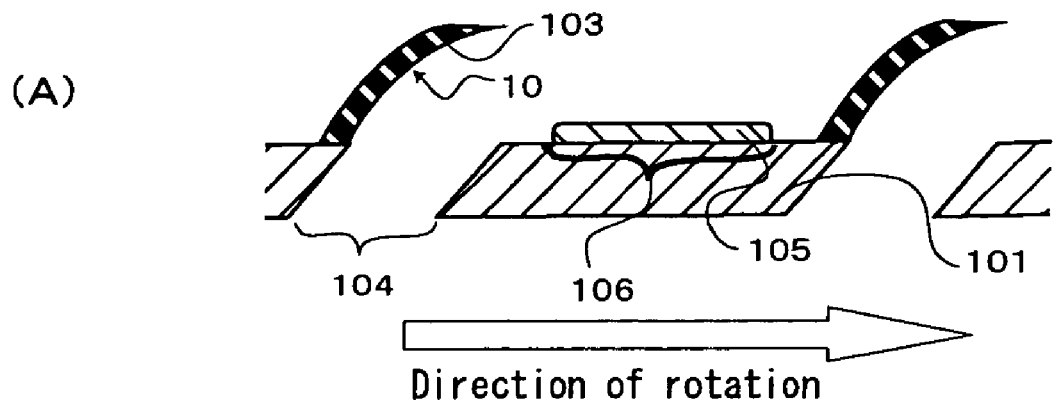
FIG. 31 is an end view that shows another example of a cross-section along the line A-B in FIG. 1.
Figure 31:
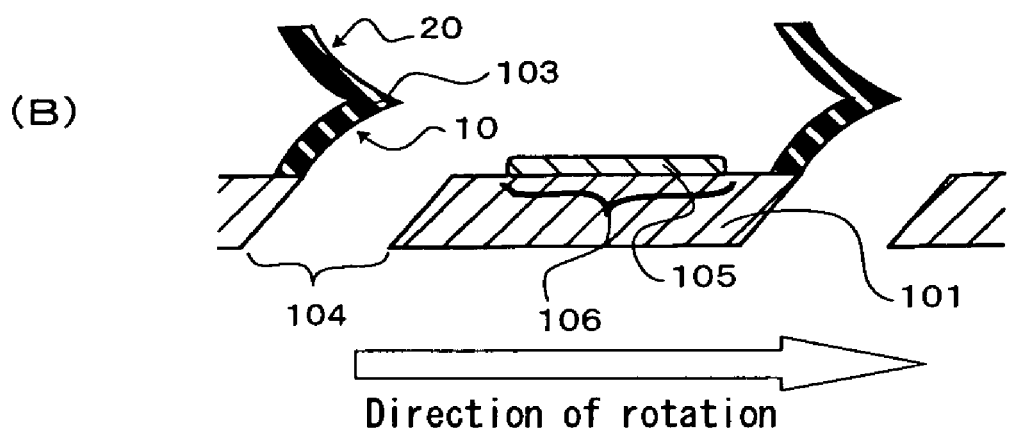
Figure 31:
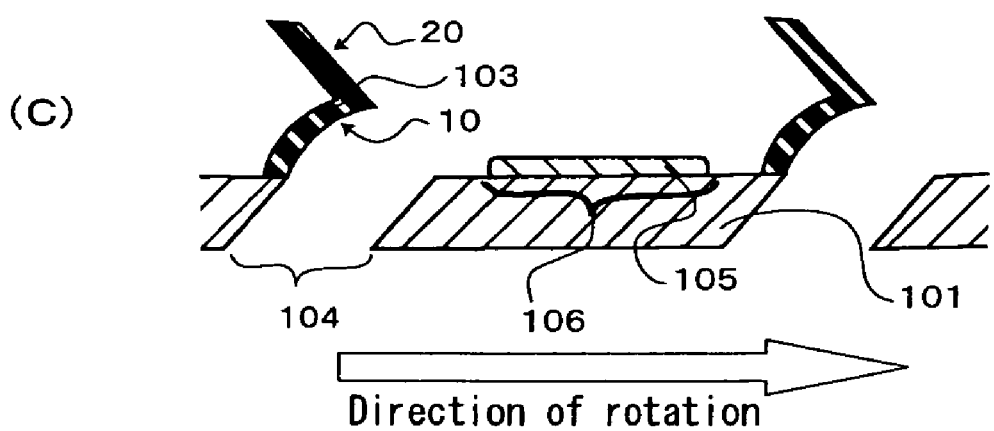

The elevation angle of the second wall face 20 is an angle formed by the second wall face 20 and a plane parallel to the wafer placement face 106, meaning an angle of elevation using the parallel plane as a level plane. As in the case of above Embodiment 1, this gas evacuation member 103 is not restricted to a square structure, and may also have a plate-shaped structure as shown in FIG. 30(C).

In the gas evacuation member having the second wall face 20, because the second wall face 20 is provided further above than the first wall face 10, it collides with gas present at a location higher than the height of the first wall face 10 due to rotation of the wafer placement board 101 and the gas is evacuated upward from the wafer placement face 106. Thus, gas molecules of outgas and the like that are present at a position higher than the height of the first wall face are evacuated upward away from the wafer surface, and so it is possible to more reliably prevent accumulation of gas in the vicinity of the wafer surface.

Figure 13:
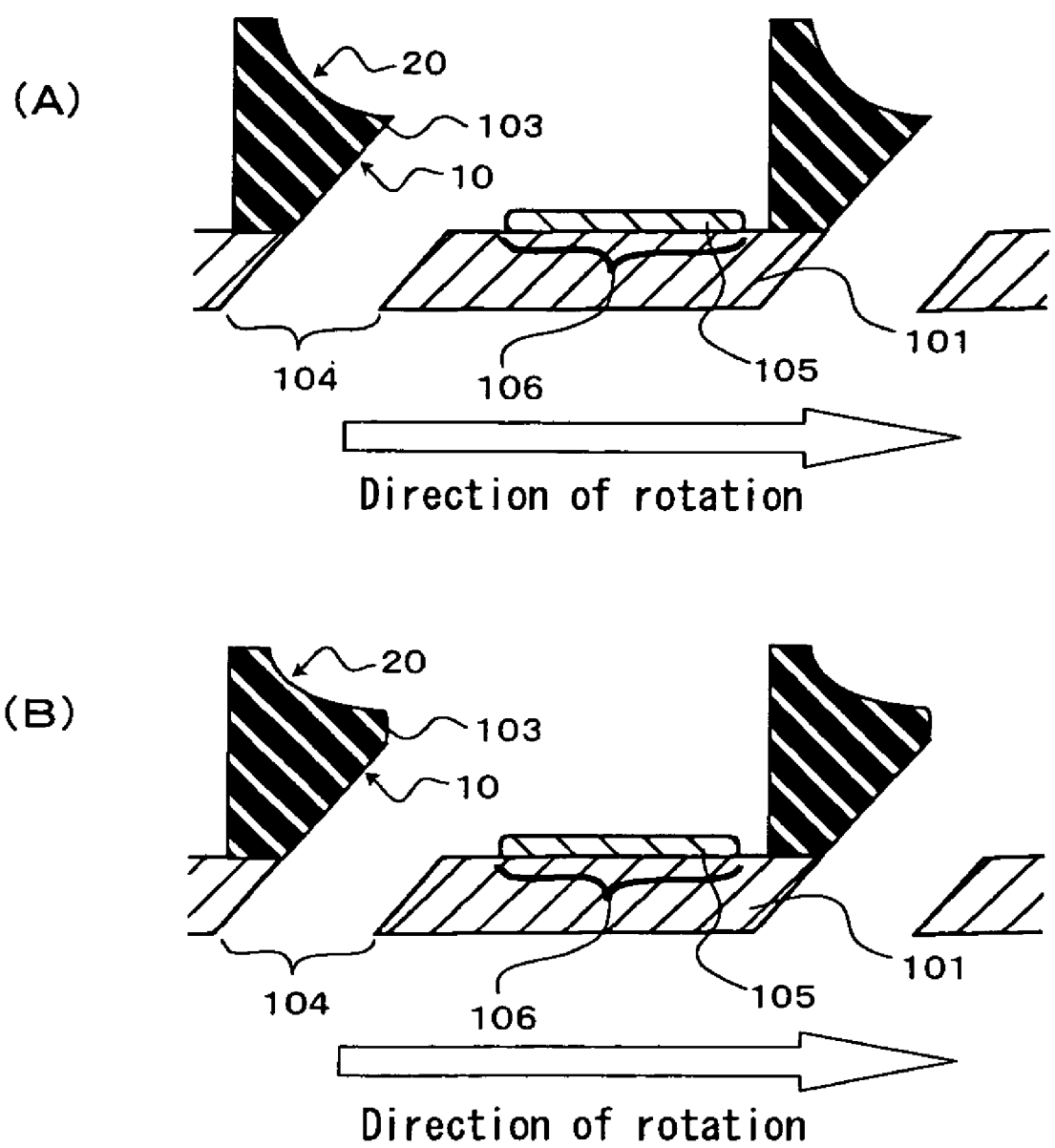
FIG. 13 is an end view that shows another example of a cross-section along the line A-B in FIG. 1.
Figure 14:
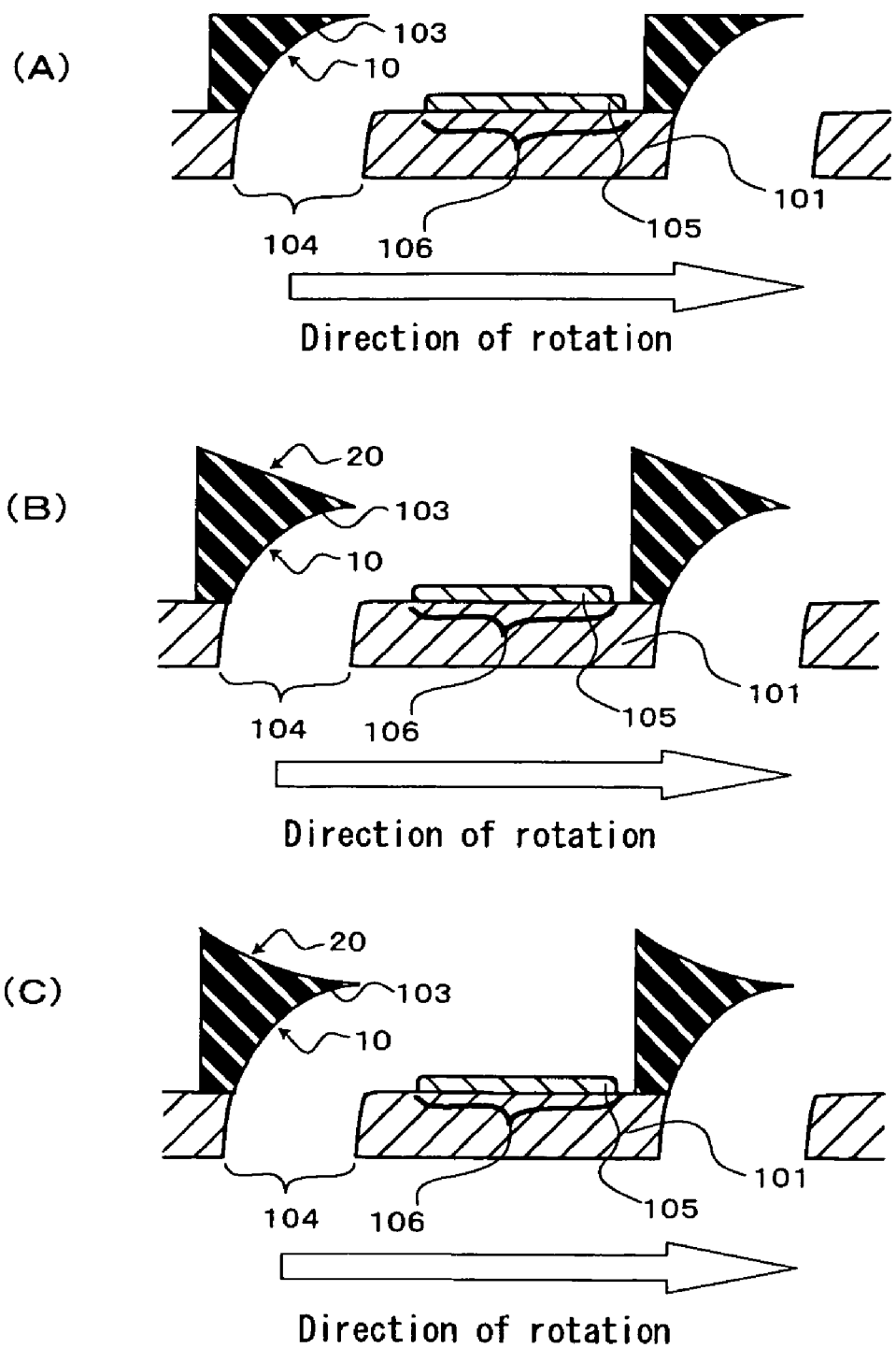
FIG. 14 is an end view that shows yet another example of a cross-section along the line A-B in FIG. 1.

As this gas evacuation member 103, as shown for example in FIG. 13(A), it is preferable to adopt a shape in which the second wall face 20 and a face that is the top face of the gas evacuation member 103 and parallel to the surface of the wafer placement board 101 are continuous. With this shape, the second wall face 20 and the top face intersect at an obtuse angle, and it is less likely that the intersecting portion will deteriorate than when they intersect at an acute angle (less than 90 degrees). However, as shown for example in FIG. 12(B) and FIG. 14(C), a shape may of course also be adopted in which the second wall face 20 is the top face of the gas evacuation member 103, and intersects with the rear wall face of the gas evacuation member 103 in the direction of rotation at an acute angle.

The gas evacuation member 103, as shown for example in FIG. 12(C), FIG. 13(B), FIG. 15(B), and FIG. 16(A) and (B), may also have a shape with a third wall face having an angle of elevation of 90 degrees that intersects the first wall face 10 and the second wall face 20. With this shape, the second wall face 20 and the third wall face, and the first wall face 10 and the third wall face, intersect at an obtuse angle greater than 90 degrees, which is preferable because deterioration due to collision with gas is therefore reduced in comparison to the case of intersecting at an acute angle.

EMBODIMENT 3

Embodiment 3 is the ion implantation apparatus according to Embodiment 2 of the present invention, including a rotating body that rotates in a fixed direction, a vacuum chamber that houses the rotating body, and an ion beam injecting portion that injects an ion beam to a wafer placed on the rotating body. As for this rotating body, the gas evacuation mechanism differs from the gas evacuation mechanisms of the rotating bodies in Embodiments 1 and 2, but is the same in other respects. Therefore the following explanation focuses on the points which differ from Embodiment 1.

This rotating body has a structure including one or two or more wafer placement boards 101 having a wafer placement face 106 on one face, a gas evacuation member 103 provided protruding from one face of the wafer placement board 101, having a gas evacuation wall face 30, and a driving portion that rotates the wafer placement board 101. The gas evacuation wall face 30 is a frontal face in the direction of rotation, and is a curved face or a flat face rising up from the one face having an angle of elevation greater than 90 degrees and less than 180 degrees relative to a flat plane including the wafer placement face 106. In this rotating body according to Embodiment 3, the angle of elevation of the gas evacuation wall face 30 differs from that in the rotating body according to Embodiment 1, and the gas discharge path is not a required element of the configuration.

Figure 7:
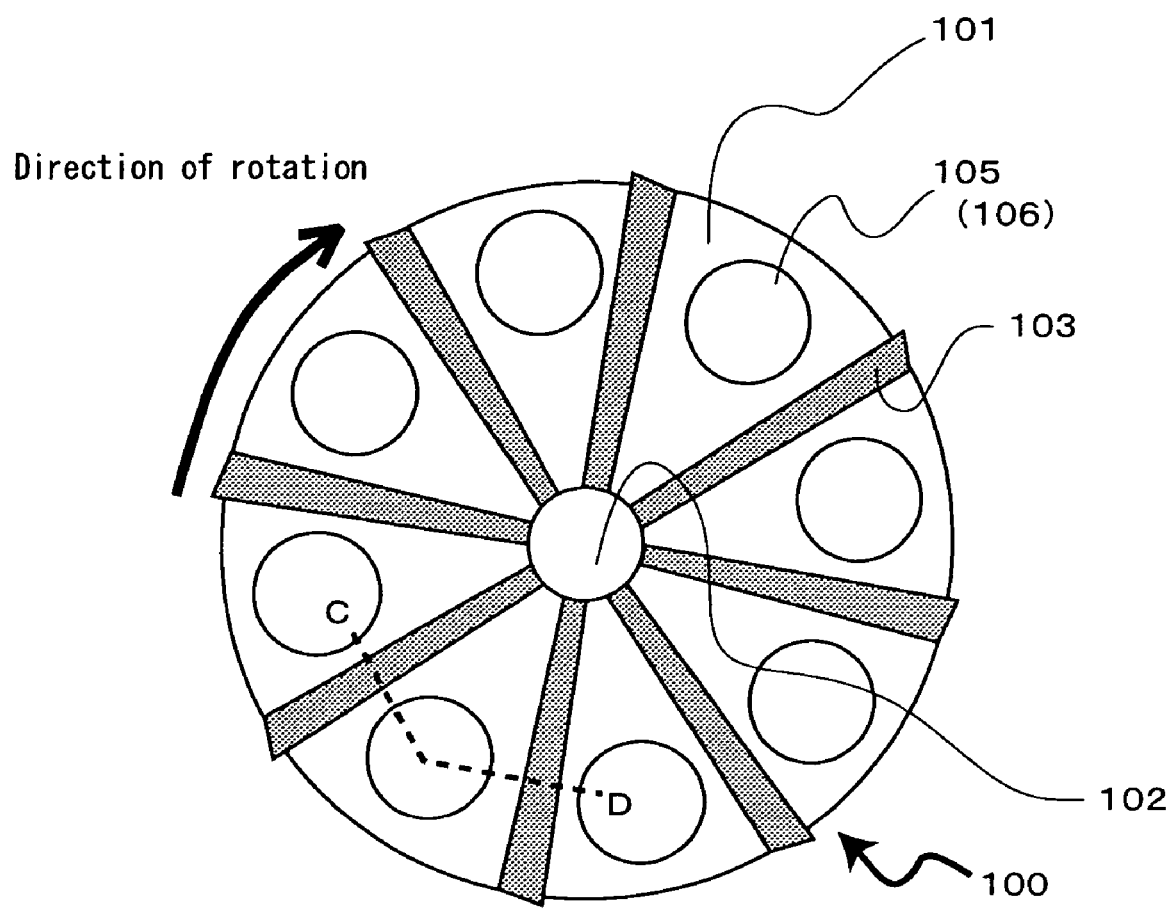
FIG. 7 is a front view that shows another example of a rotating body according to the present invention.
Figure 8:
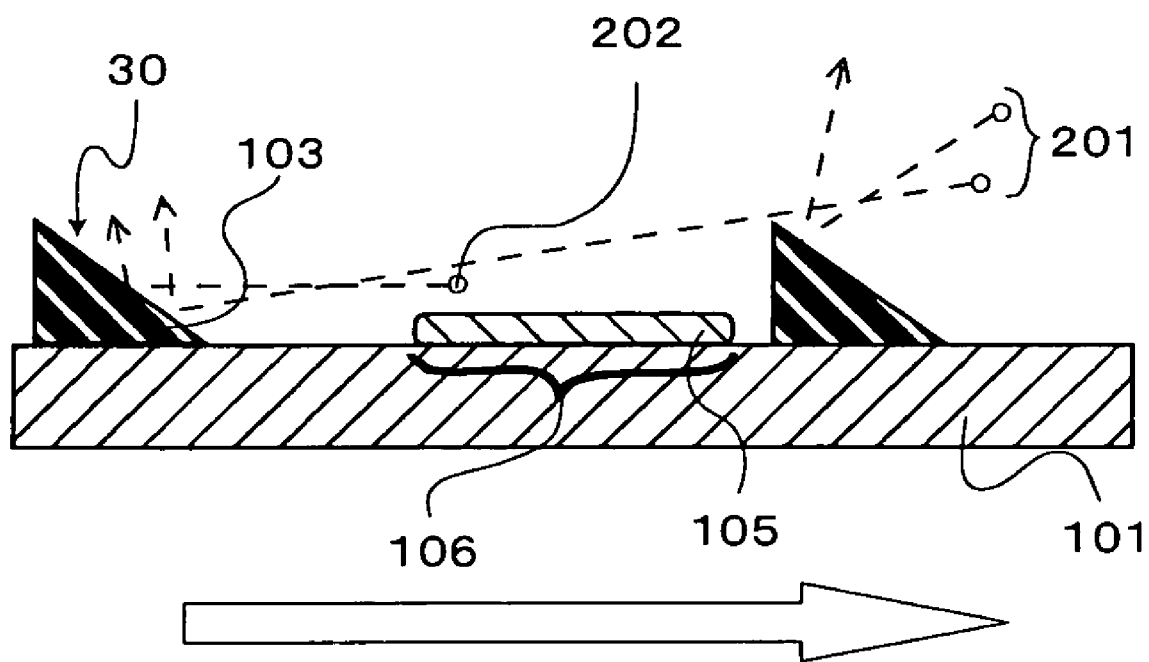
FIG. 8 is an end view that shows an example of a cross-section along line C-D in FIG. 7.

The rotating bodies shown for example in FIG. 7 and FIG. 8 are given as specific examples of the rotating body according to Embodiment 3. FIG. 7 is a front view of the rotating body 100, and FIG. 8 is a schematic diagram that shows the shape of a cross-section along line C-D in FIG. 7

This rotating body 100, as shown in FIG. 7, includes a wafer placement board 101 that is constituted by one disk-shaped board, a driving portion 102 disposed in the center of rotation of the disk-shaped wafer placement board 101, and gas evacuation members 103 having the gas evacuation wall faces 30, provided concentric to the center of rotation and protruding from the one face that has the wafer placement faces 106 of the wafer placement board 101.

These gas evacuation members 103 sandwich one wafer placement face 106 (wafer 105), and are disposed both ahead of and behind the wafer placement faces 106 in the direction of rotation.

As shown in FIG. 8, the gas evacuation wall faces 30 of these gas evacuation members 103 are frontal faces in the direction of rotation, and are flat faces rising up from the one face with an angle of elevation of 135 degrees when a plane parallel to the wafer placement faces 106 is used as a level plane.

As shown for example in FIG. 33(C), the angle of elevation of the gas evacuation wall face 30 is an angle formed by the gas evacuation wall face 30 and a plane parallel to the wafer placement face 106 or a plane parallel to the direction of rotation, meaning the angle of elevation using the parallel plane as a level plane. Because the gas evacuation wall face 30 has the shape of a level plane as shown in FIG. 8, it has a fixed angle of elevation, in this example being 135 degrees.

Also, the height of these gas evacuation members 103 from the surface of the wafer placement board is more than 0.5 mm.

Following is a further explanation of an ion implantation apparatus provided with this sort of rotating body.

As shown in FIG. 8, due to rotation of the wafer placement board 101, the outgas 202 generated from the resist moves relatively backwards in the direction of rotation and collides with the gas evacuation wall face 30 of the gas evacuation members 103. Here, because the gas evacuation wall face 30 of the gas evacuation members 103 has an angle of elevation of 135 degrees, in the backward direction of rotation, the outgas 202 that has collided with the gas evacuation wall face 30 is oriented and moves upward of a flat plane including the wafer placement face 106. As a result, the outgas 202 that has collided with the gas evacuation wall face 30 is evacuated from the wafer surface.

With rotation of the wafer placement board 101, gas 201 floating inside the vacuum chamber also moves relatively backwards in the direction of rotation. Same as the outgas 202, a part of the gas 201 that moves relatively near to the flat plane including the wafer placement face 106 collides with the gas evacuation wall faces 30 of the gas evacuation members 103 that are provided ahead of the wafer placement faces 106 in the direction of rotation. As a result, the part of the gas has its course obstructed and is evacuated upward from the wafer placement faces 106. Accordingly, accumulation of gas in the vicinity of the wafer surface is prevented.

Here, gas that has been moved upward away from the wafer placement faces 106 is primarily discharged from inside the vacuum chamber 302 via the first pump 303 that is open to the chamber space of the side of the wafer placement face in the vacuum chamber.

In this Embodiment 3, a gas discharge path is not an essential element of the configuration, but as in Embodiment 1, it is possible to provide a gas discharge path in the rotating body. In this case, in addition to the first pump 303, a second pump 304 is disposed in the chamber space of the side opposite to the wafer placement face inside the vacuum chamber.

Following is a description of embodiments other than the structures in FIGS. 7 and 8.

(Aggregate Shape and Number of Wafer Placement Boards)

Figure 23:
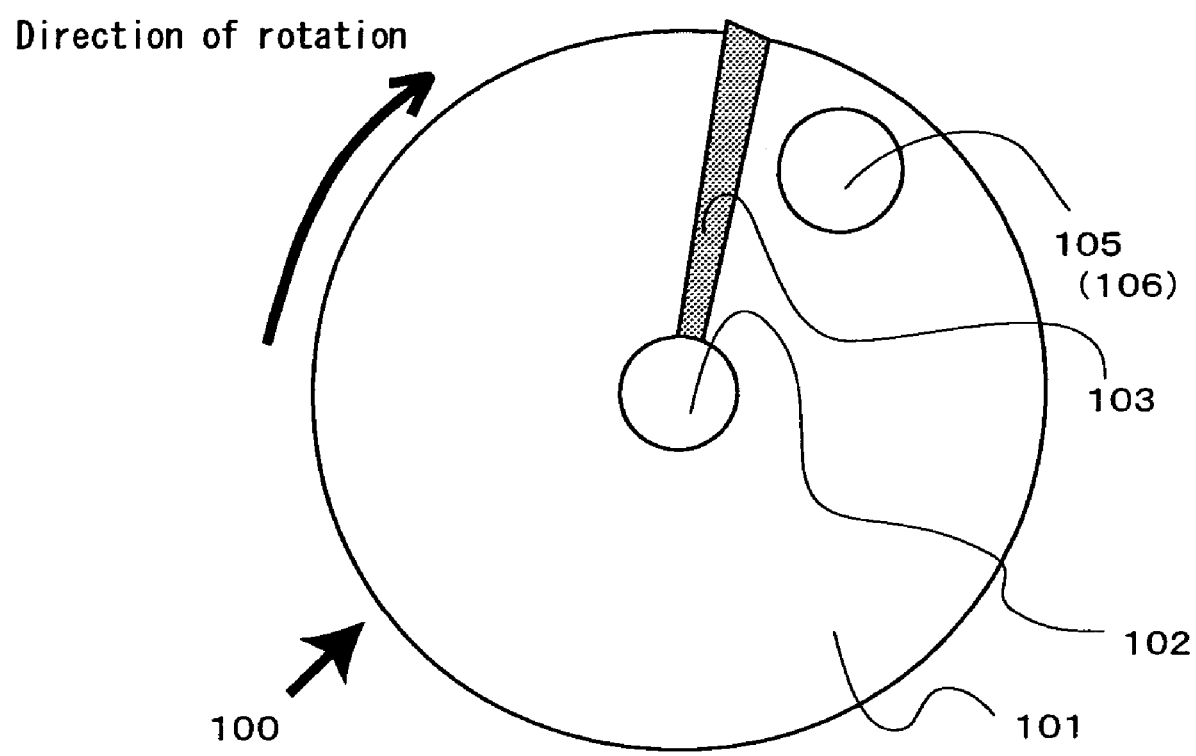
FIG. 23 is a front view that shows another example of a rotating body according to the present invention.
Figure 24:
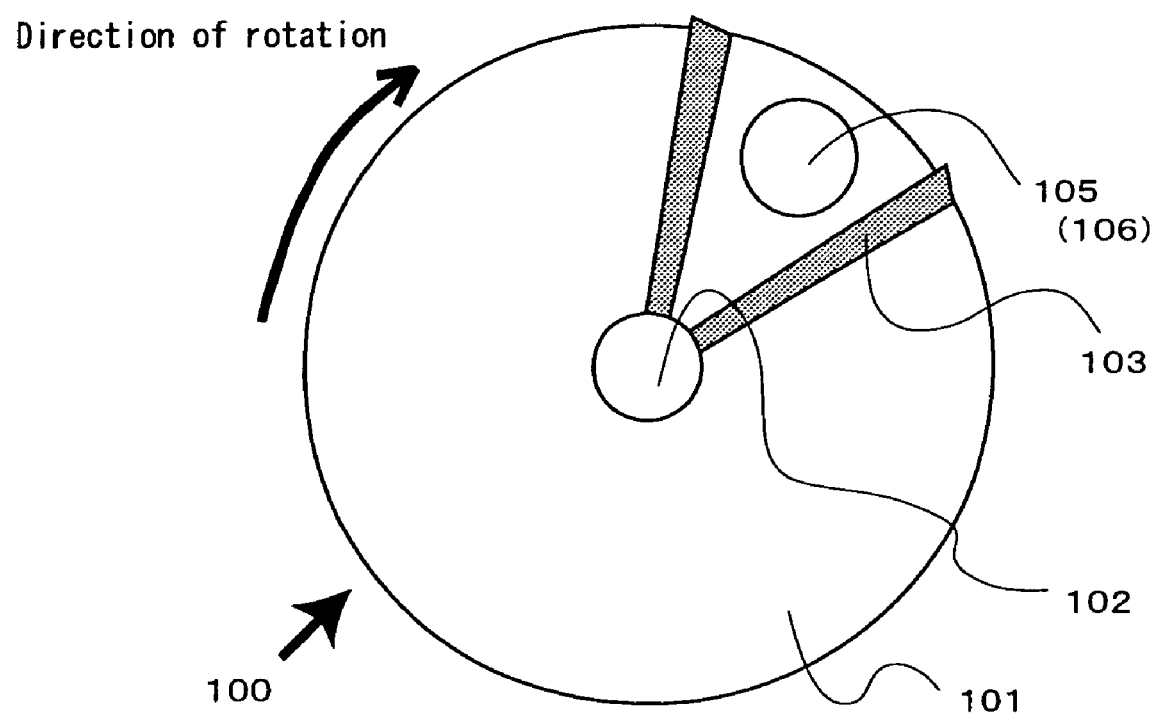
FIG. 24 is a front view that shows another example of a rotating body according to the present invention.
Figure 25:
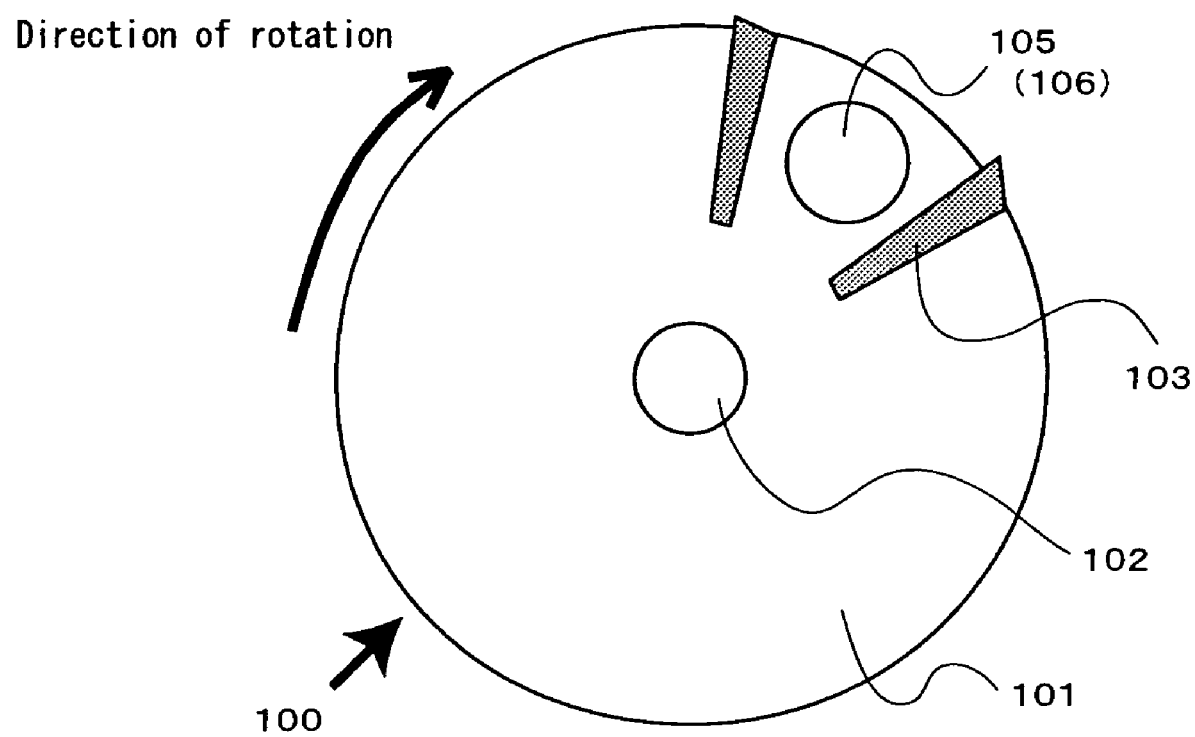
FIG. 25 is a front view that shows another example of a rotating body according to the present invention.

The number of wafer placement boards 101 can be made one or two or more. When the wafer placement board 101 that is rotated by the driving portion 102 is made to be one board, a propeller-shaped structure may be adopted in which the wafer placement board 101 is provided in a staff portion of the columnar driving portion 102 as shown in FIG. 18(B2), or as shown in FIG. 19(B) a tree-shaped structure may be adopted in which the wafer placement board 101 is provided at a branch end of the driving portion 102 having one branch (arm), or as shown in FIGS. 23 to 25, a structure may be adopted in which the wafer placement board 101 is made of one disk-shaped board, and the driving portion 102 is provided in the center of rotation of the disk-shaped board. In some diagrams a portion of the gas evacuation members 103 have been omitted for the sake simplification.

When adopting a configuration in which there are two or more wafer placement boards 101 that are rotated by the driving portion 102, for example, a propeller-shaped structure can be adopted in which three wafer placement boards 101 are provided in a staff portion of the columnar driving portion 102 as shown in FIG. 18(A2), or as shown in FIG. 19(A) or (C) a tree-shaped structure can be adopted in which four or eight wafer placement boards 101 are provided at the branch ends of the driving portion 102 having a four or eight-branch structure, or as shown in FIG. 21, a disk-shaped structure can be adopted in which two fan-shaped wafer placement boards 101 are provided in the staff portion of the columnar driving portion 102 in a disk shape with a predetermined spacing between each other.

It is of course possible to form the disk-shaped structure shown in FIG. 7, FIG. 23, and FIG. 24 using two or more wafer placement boards 101. The operational effects of the case of adopting a disk shape for the rotating body and the preferable arrangement inside the vacuum chamber are basically the same as in the case of above Embodiment 1.

(Shape of the Gas Evacuation Wall Face)

As stated above, the gas evacuation wall face 30 of the gas evacuation member 103 is a frontal face in the direction of rotation, and as long as it is a face rising up from the one face having an angle of elevation greater than 90 degrees and less than 180 degrees when a plane parallel to the one face having the wafer placement face 106 is used as a level plane, the gas evacuation wall face 30 of the gas evacuation member 103 is not restricted to the flat face shown in FIG. 8 or FIG. 33(C) mentioned above, and may also be a curved face as shown in FIG. 33(D). Also, as long as the gas evacuation wall face 30 can lead the collided gas to the gas discharge path 104, its surface does not have to be a mirrored surface, and a more or less uneven surface may also be provided.

The reason that the angle of elevation is made larger than 90 degrees is that when the angle of elevation is 90 degrees or less than 90 degrees, the gas molecules that have collided with the wall face receive repulsive force in a downward direction or a direction that is parallel to the wafer placement face, and so it is not possible to evacuate the gas molecules upward from the wafer surface. On the other hand, when the face has an angle of elevation that is greater than 180 degrees, it is no longer a wall face positioned ahead in the direction of rotation. Accordingly, it is necessary to make the angle of elevation more than 90 degrees or less than 180 degrees.

(Overall Shape and Arrangement of the Gas Evacuation Member)

The gas evacuation member 103 can for example adopt the shape and arrangement disclosed below.

Figure 17:
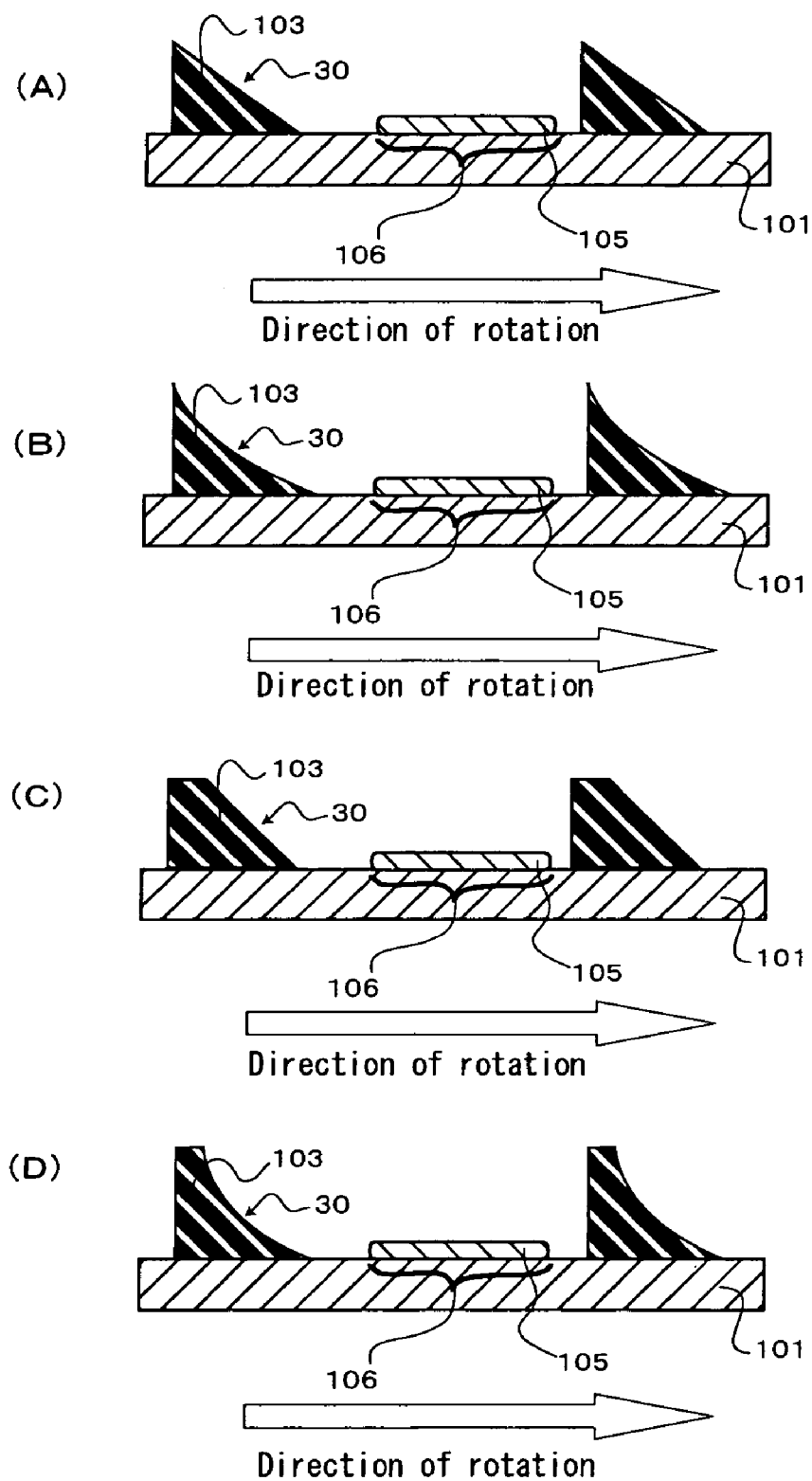
FIG. 17 is an end view that shows another example of a cross-section along the line C-D in FIG. 1.
Figure 32:
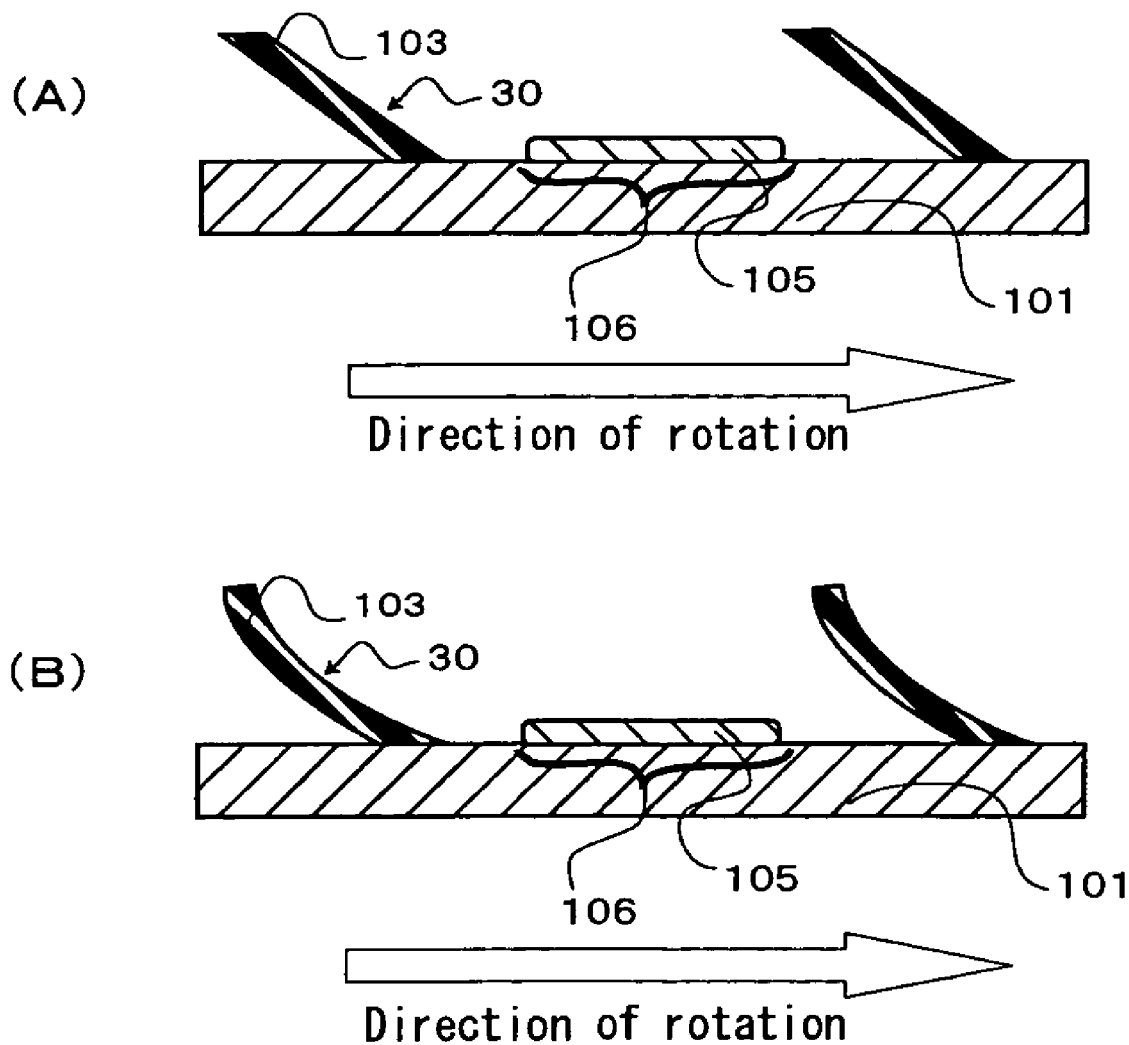
FIG. 32 is an end view that shows another example of a cross-section along the line C-D in FIG. 7.

The gas evacuation member 103 is not restricted to the square structure shown in FIG. 8 and FIG. 17, and can for example adopt the plate shape shown in FIG. 32.

Also, the gas evacuation member 103 may adopt a configuration in which it has a top face parallel to the wafer placement face 106, and this top face intersects the gas evacuation wall face. With this structure, because the gas evacuation wall face and the top face intersect at an obtuse angle greater than 90 degrees, in comparison to the case of intersecting at an acute angle (less than 90 degrees), deterioration of the intersecting portion due to gas collision is less likely to occur. However, as shown for example in FIGS. 17(A) and 17(B), of course a structure may also be adopted having a zenith with an acute angle.

Additionally, a structure may also be adopted in which the gas evacuation member 103 is provided integrally with the wafer placement board 101, or a structure in which independent members are fixedly or removably joined. The operational effects of adopting an integrally provided configuration or a configuration in which independent members are joined are the same as in above Embodiment 1.

Matters related to the height of the gas evacuation member 103 are the same as in the case of above Embodiment 1.

Same as in above Embodiment 1 and as shown for example in FIG. 9(B), when the end of the beam line chamber 901 that injects the ion beam 902 protrudes into the vacuum chamber 302, it is preferable to make the space between the outer circumference of the gas evacuation members 103 and the edge of the beam line chamber 901 about 0.5 mm to 50 mm.

With respect to the disposition of the gas evacuation member 103 relative to the center of rotation as well, same as in the case of the above Embodiment 1, although a detailed explanation is omitted, it is preferable in consideration of the object of preventing accumulation of gas on the wafer surface that the gas evacuation member 103, as shown for example in FIG. 23, be provided behind the wafer placement face 106 in the direction of rotation. Further, as shown for example in FIG. 24, it is more preferable to adopt a configuration in which gas evacuation members 103 are disposed both ahead of and behind in the direction of rotation of the wafer.

It is possible to adopt a configuration in which two or more of the gas evacuation members 103 are disposed concentric to the center of rotation of the rotating body, and as shown for example in FIG. 25, it is possible to adopt a configuration in which they are provided on only a part of a radial line that has the driving portion as a center.

As explained above, with the ion implantation apparatus according to this Embodiment 3, because the gas evacuation member 103 having the gas evacuation wall face 30 with the above shape is provided protruding from one face of the wafer placement board 101, due to rotation of the wafer placement board 101 the gas evacuation wall face 30 is collided with gas present on the side of one face of the wafer placement board 101, and the gas can be evacuated upward from the wafer placement face 106.

Thus, it is possible to evacuate gas such as outgas generated from the wafer, and outgas or ambient gas that is floating inside the vacuum chamber. As a result, because accumulation of gas on the wafer surface is prevented, it is possible to suppress the generation of crystal defects in the wafer and the generation of dose shift when performing ion implantation.

Supplementary Remarks

Figure 26:
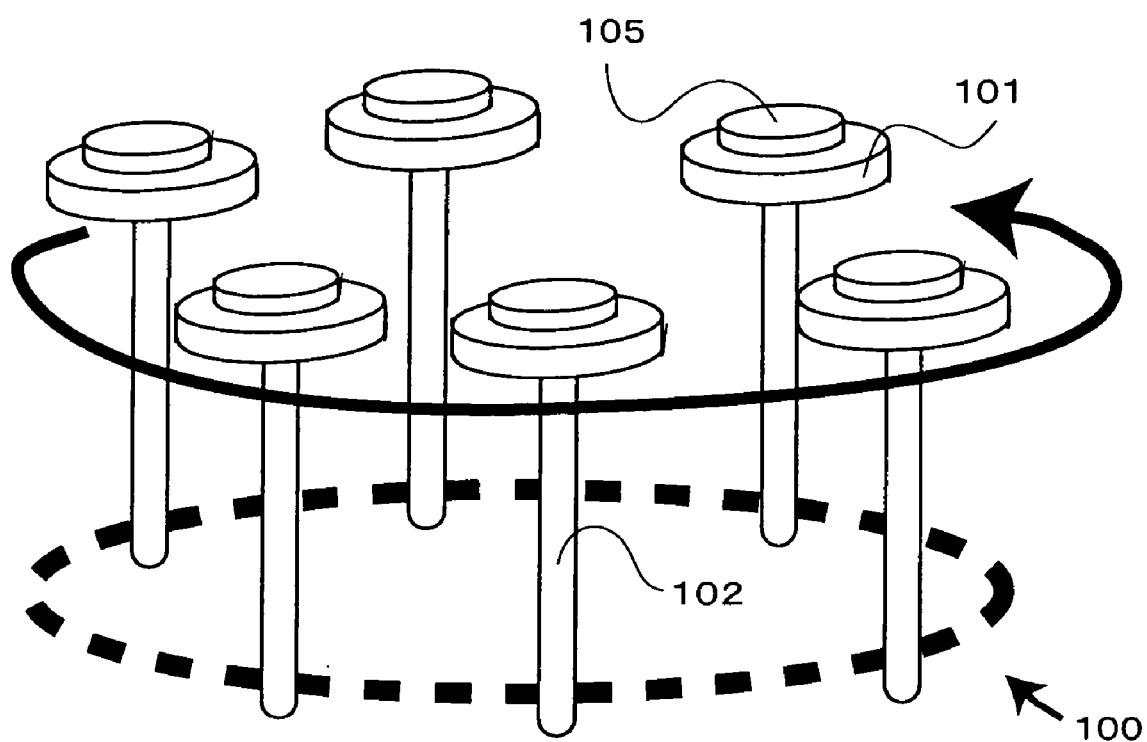
FIG. 26 is a perspective view that shows another example of a rotating body according to the present invention.
Figure 27:
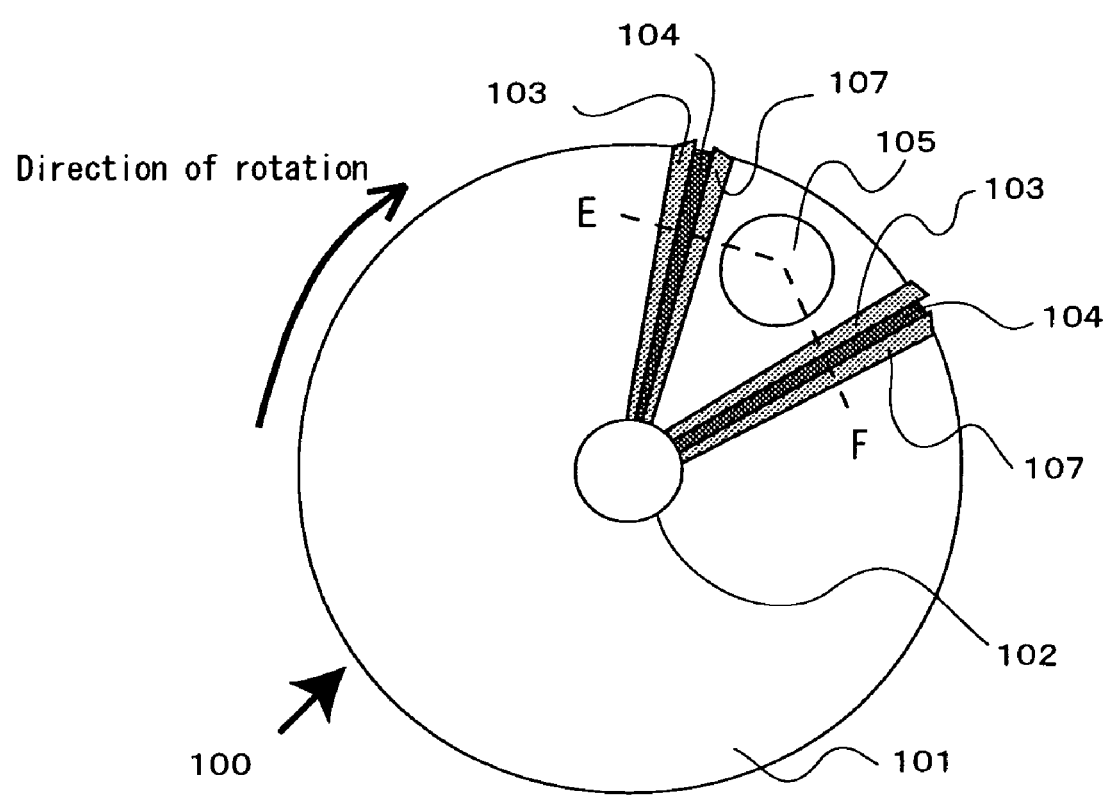
FIG. 27 is a front view that shows another example of a rotating body according to the present invention.

<1> In the Embodiments 1 to 3 described above, a rotating body was disclosed that has a driving portion which axially rotates, but the driving portion according to the present invention is not restricted to this configuration; a configuration may also be adopted in which it is possible to rotatably drive one or more wafer placement boards 101. For example, as shown in FIG. 26, a configuration may adopted in which a conveyor-type rotating body is provided that drives the wafer placement board 101 in a circle. Also, in FIG. 26, the gas evacuation member 103 and the gas discharge path 104 are not shown in order to simplify the diagram.

Figure 6:
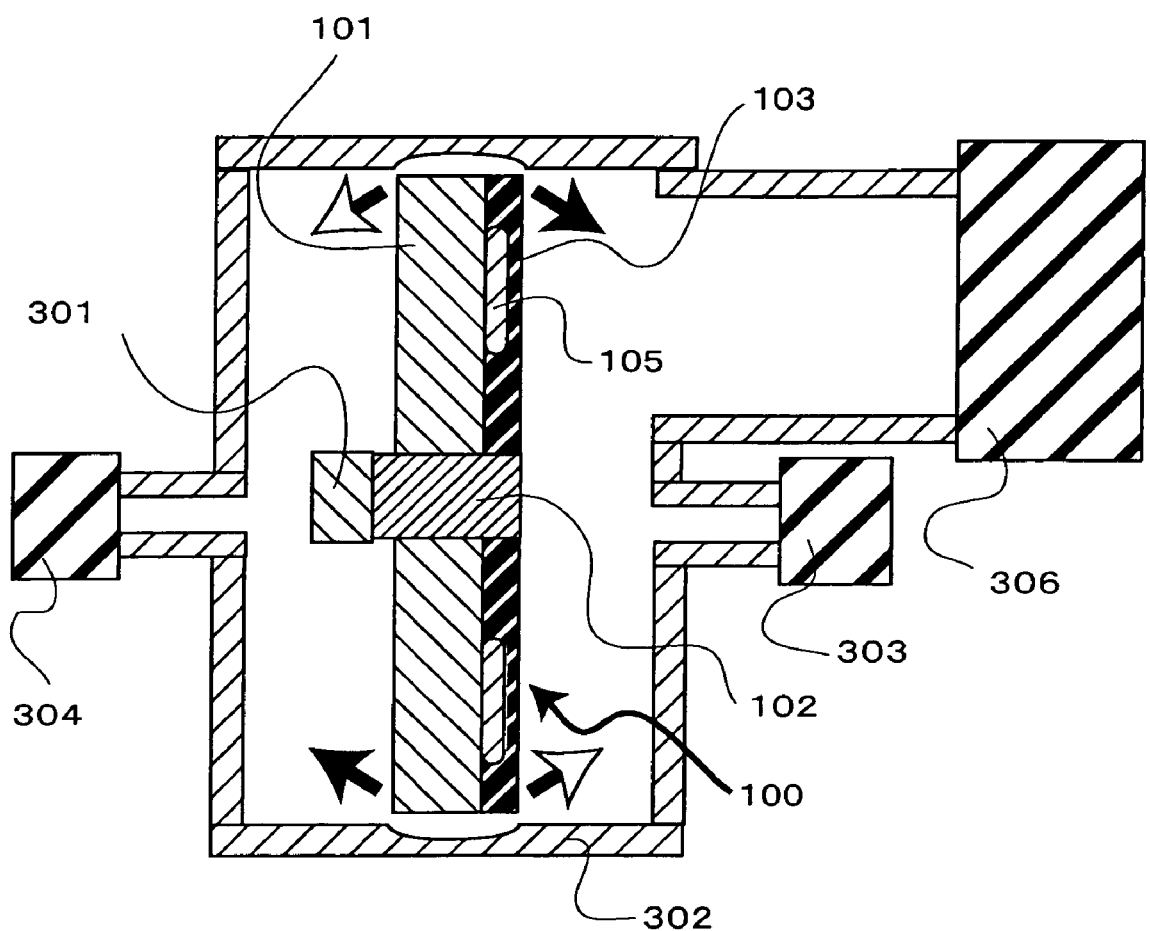
FIG. 6 is a sagittal cross-sectional view of another example of the ion implantation apparatus according to the present invention.

<2> When implanting ions in a wafer, the angle of ion implantation may be controlled in order to suppress channeling or the like, but in this case, as shown for example in FIG. 6, the wafer placement board 101 may be tilted along with the driving portion 102 having a fixed shaft 301. For example, they may tilt in the direction of the black arrow or the white arrow.

When tilting the rotating body 100, in order to make the space between the outer circumference of the rotating body 100 and the inner wall of the vacuum chamber sufficiently small while not allowing the end of the wafer placement board 101 to catch against the inner wall of the vacuum chamber, as shown for example in FIG. 6, the inner wall of the vacuum chamber facing the outer circumference of the rotating body 100 may be curved in a circular arc shape. This circular arc has a prescribed radius that is longer than the distance from the center of tilt of the rotating body 100 to the edge of the wafer placement board 101.

Figure 4:
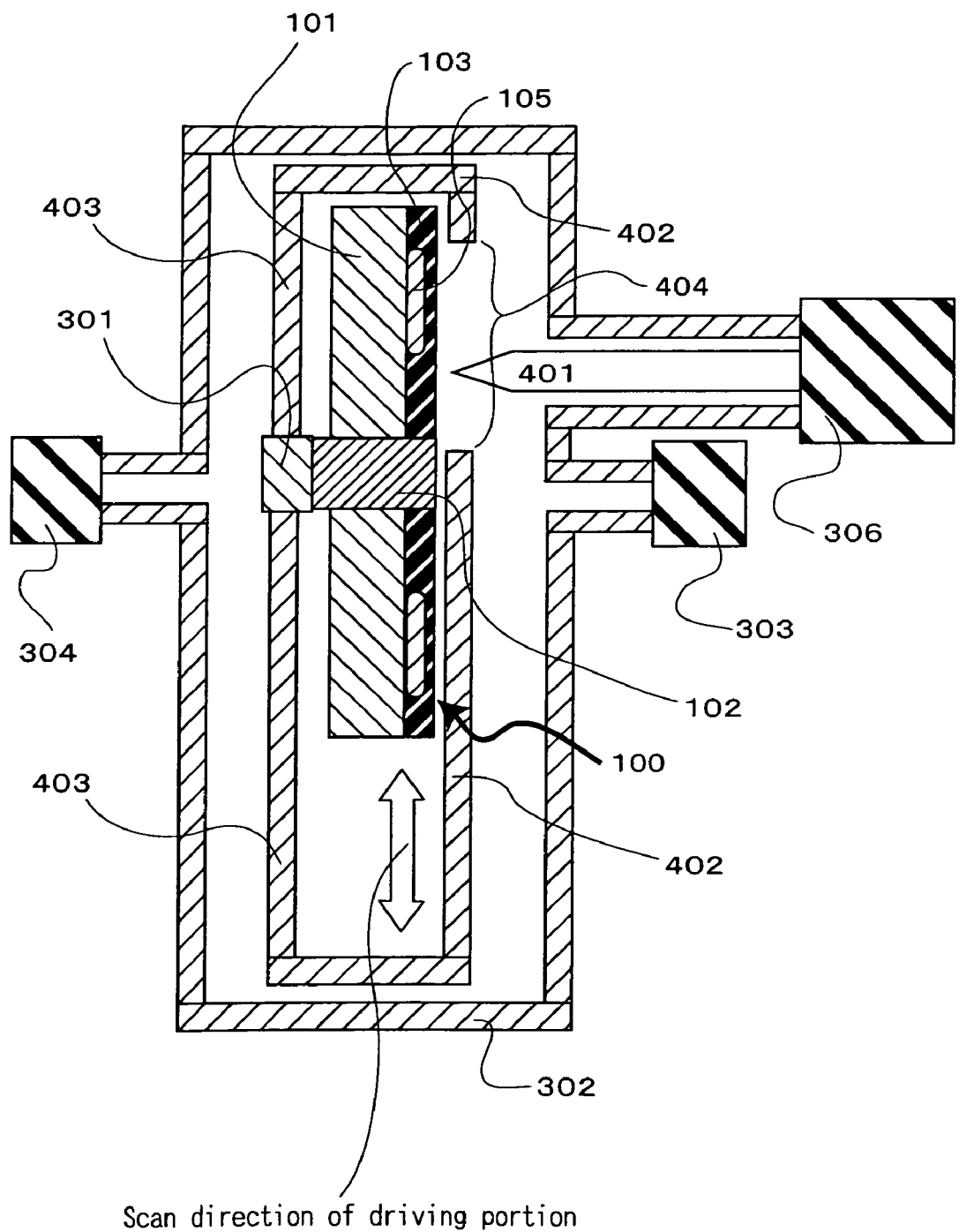
FIG. 4 is a sagittal cross-sectional view that shows another example of the ion implantation apparatus according to the present invention.
Figure 29:
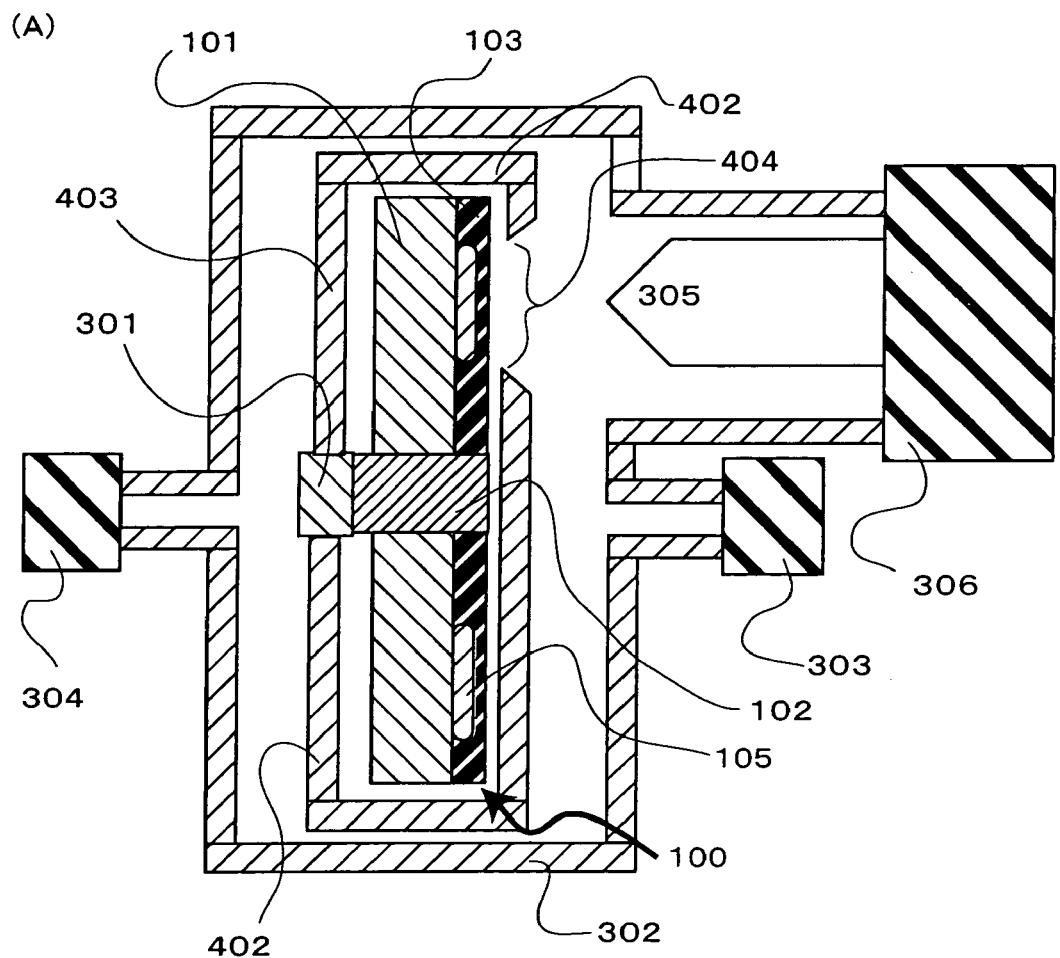
FIG. 29 is a sagittal cross-sectional view that shows another example of the ion implantation apparatus according to the present invention, and a conceptual diagram for illustrating the shape of an aperture portion of the subchamber in that apparatus.
Figure 29:
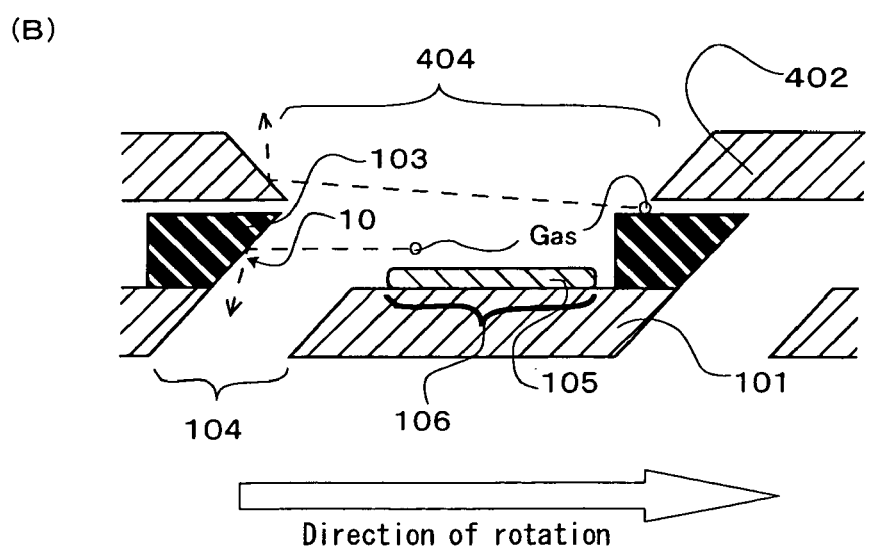

<3> In the Embodiments 1 to 3 described above, an ion implantation apparatus was disclosed in which the rotating body 100 is provided tilted out in the vacuum chamber 302, but as shown for example in FIG. 4, FIG. 5, and FIG. 29, a configuration is also possible in which a subchamber 402 is disposed in the vacuum chamber 302 that has an opening portion open to the top, and the rotating body 100 is disposed in this subchamber 402. In this case, ion beams 401 and 305 are irradiated to the wafer 105 via the opening portion 404, and gas moved away from the wafer surface by the gas evacuation member 103 is discharged out of the subchamber via this opening portion 404. On the other hand, gas discharged from the gas discharge path 104 is discharged out of the subchamber by passing through the space of a spoke 403 that covers the rear face of the rotating body 100.

Here, it is not preferable for the gas that has been moved away from the wafer surface by the gas evacuation member 103 to receive repulsive force such that it is again returned towards the wafer surface due to colliding with the end face of this opening portion 404. Thus, when a subchamber is provided, as shown for example in FIG. 29(B), the shape of the end face of the opening portion 404 is made such that it is easy for the gas to pass the opening portion 404 and exit out the subchamber.

Figure 28:
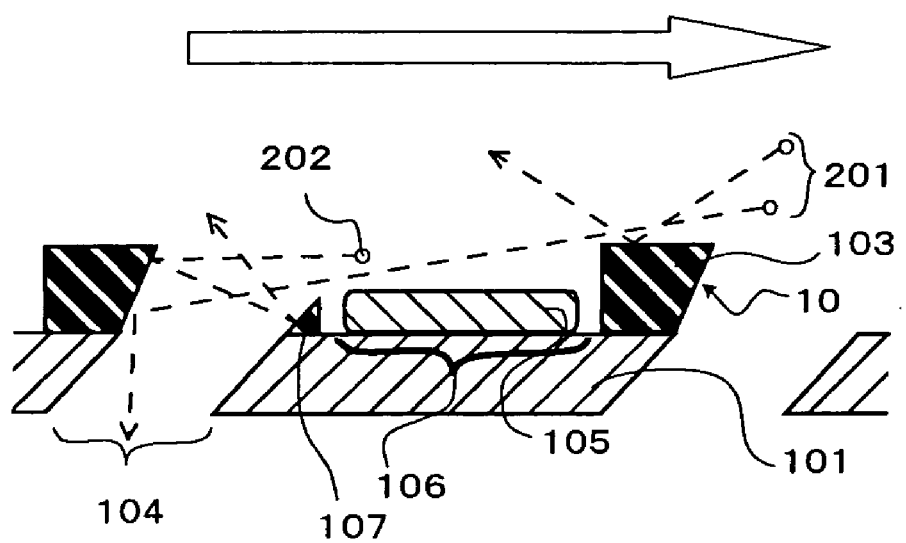
FIG. 28 is an end view that shows a cross-section along line E-F in FIG. 27.
Figure 28:
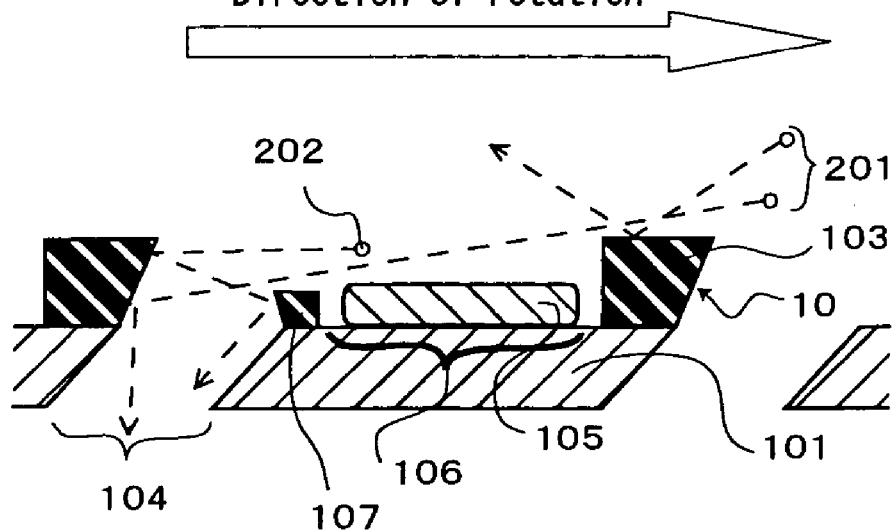

<4> Sufficient gas evacuation performance is obtained even with the rotating bodies according to the above Embodiments 1 to 3, but as shown in FIGS. 28(A) and (B), a gas cutoff member 107 may also be disposed as a member for evacuating gas from the wafer surface. This gas cutoff member 107 has a gas cutoff wall face on the rear side in the direction of rotation, and by being provided behind the wafer placement face in the direction of rotation and being provided protruding from the one face that has the wafer placement face ahead of the gas evacuation member 103 in the direction of rotation, when gas moves from back to front in the direction of rotation due to collision with the gas evacuation member 103 and the like, the gas cutoff member 107 functions to block the course of that gas and move it away from the surface of the wafer.

When providing the gas shutoff member 107, its height is made less than the height (thickness) of the wafer placed on the wafer placement board. This is because when it is taller than the wafer, the frontal face of the gas shutoff member 107 in the direction of rotational driving pops out higher than the wafer, and the danger of generated outgas colliding with this face and affixing to the wafer becomes high.

<5> As explained above, in this type of ion implantation apparatus, the generation of outgas from a photoresist mask is unavoidable and can not be eliminated, but the amount of outgas given off from the raw materials of components that constitute the rotating body and the vacuum chamber (mainly metal) can be somewhat suppressed by coating the surface of these constituent components with high-purity silicon, silicon carbide, carbon graphite, silicon nitride, or silicon oxide, or by making the raw materials themselves these materials.

As explained above, according to the present invention, it is possible to realize an ion implanting apparatus with which it is possible to quickly and reasonably evacuate gas from a wafer surface such as outgas generated from the wafer, outgas floating in a vacuum chamber, or residual ambient gas. With this apparatus, the generation of crystal defects in the wafer and the generation of dose shift when implanting ions are suppressed, and so the wafer production yield is markedly improved. Thus, this invention has great industrial applicability.

What is claimed is:

1. An ion implantation apparatus comprising:
 a rotating body that rotates in a fixed direction,
 a vacuum chamber that houses the rotating body, and
 an ion beam injecting portion that injects an ion beam to
  a wafer placed on the rotating body, wherein the rotating body comprises one or two or more wafer placement boards having a wafer placement face on one face,
a gas discharge path for the purpose of discharging gas present on the wafer placement face to a face opposite to the wafer placement face,
a gas evacuation member provided protruding from one face of the wafer placement board, having a first gas evacuation wall face, and
a driving portion that rotates the wafer placement board,
wherein the gas evacuation member is disposed behind the gas discharge path in the direction of rotation, the first wall face of the gas evacuation member is a frontal face in the direction of rotation, and is a curved face or a flat face rising up from the one face having an angle of elevation greater than 0 degrees and less than 90 degrees when a plane parallel to the wafer placement face is used as a level plane, and
functions such that gas is discharged from the gas discharge path to the face opposite to the one face of the wafer placement board by the first wall face colliding with gas present on one face of the wafer placement board due to rotation of the wafer placement board.

2. The ion implantation apparatus according to claim 1, wherein the gas evacuation member further has a second gas evacuation wall face that is a face other than the first wall face, and is a frontal face in the direction of rotation and is constituted by a curved face or a flat face having an angle of elevation greater than 90 degrees and less than 180 degrees when a plane parallel to the wafer placement face is used as a level plane, and
functions such that gas is evacuated upward from the wafer placement face by the second wall face colliding with gas present on one face of the wafer placement board due to rotation of the wafer placement board.

3. The ion implantation apparatus according to claim 1, wherein the gas present on the wafer placement face is outgas generated from a wafer placed on the wafer placement face.

4. The ion implantation apparatus according to claim 1, wherein the height of the gas evacuation member from the wafer placement face is more than 0.5 mm.

5. The ion implantation apparatus according to claim 1, wherein the rotating body is disk-shaped with two or more wafer placement boards radially arranged with the driving portion as a center of rotation, and
two or more of the gas evacuation members on the rotating body are concentrically disposed relative to the center of rotation.

6. The ion implantation apparatus according to claim 5, wherein the gas discharge path is a space between the two or more wafer placement boards.

7. The ion implantation apparatus according to claim 1, wherein the wafer placement board is constituted by one disk-shaped board,
the gas discharge path is constituted by a through-hole provided in the disk-shaped board, and
the driving portion is disposed in a center of rotation of the disk-shaped board.

8. The ion implantation apparatus according to claim 7, wherein the gas evacuation member is a blade made by cutting and erecting a part of the disk-shaped board in the one face, and the through-hole is a hole formed in a cut and erected portion.

9. The ion implantation apparatus according to claim 8, wherein two or more of the through-holes and the blade are concentrically disposed relative to the center of rotation of the disk-shaped board.

10. An ion implantation apparatus comprising:
a rotating body that rotates in a fixed direction,
a vacuum chamber that houses the rotating body, and
an ion beam injecting portion that injects an ion beam in a wafer placed on the rotating body,
wherein the rotating body comprises one or two or more wafer placement boards having a wafer placement face on one face,
a gas evacuation member provided protruding from one face of the wafer placement board, having a gas evacuation wall face, and
a driving portion that rotates the wafer placement board,
wherein the gas evacuation wall face is a frontal face in the direction of rotation, and is a curved face or a flat face rising up from the one face having an angle of elevation greater than 90 degrees and less than 180 degrees when a plane parallel to the wafer placement face is used as a level plane, and
functions such that gas is evacuated upward from the wafer placement face by the gas evacuation wall face colliding with gas present on one face of the wafer placement board due to rotation of the wafer placement board.

11. The ion implantation apparatus according to claim 10, wherein the rotating body is disk-shaped with two or more wafer placement boards radially arranged with the driving portion as a center of rotation, and
two or more of the gas evacuation members on the rotating body are concentrically disposed relative to the center of rotation.

12. The ion implantation apparatus according to claim 11, wherein the gas discharge path is a space between two or more wafer placement boards.

* * * * *